United States Patent
Leung et al.

(10) Patent No.: US 7,188,199 B2
(45) Date of Patent: Mar. 6, 2007

(54) DMA CONTROLLER THAT RESTRICTS ADC FROM MEMORY WITHOUT INTERRUPTING GENERATION OF DIGITAL WORDS WHEN CPU ACCESSES MEMORY

(75) Inventors: Kafai Leung, Austin, TX (US); Ka Y. Leung, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 481 days.

(21) Appl. No.: 10/752,740

(22) Filed: Jan. 7, 2004

(65) Prior Publication Data
US 2004/0267986 A1 Dec. 30, 2004

Related U.S. Application Data

(63) Continuation-in-part of application No. 10/453,369, filed on Jun. 3, 2003, now Pat. No. 6,882,298.

(51) Int. Cl.
*G06F 3/00* (2006.01)
*H03M 1/12* (2006.01)

(52) U.S. Cl. ............... 710/69; 710/22; 710/28; 341/172; 341/118; 341/50; 341/141

(58) Field of Classification Search ........... 710/22, 710/69, 28; 341/172, 118, 50, 141
See application file for complete search history.

(56) References Cited

U.S. PATENT DOCUMENTS

| | | | |
|---|---|---|---|
| 4,399,426 A | 8/1983 | Tan | |
| 5,581,252 A | 12/1996 | Thomas | |
| 5,684,487 A | 11/1997 | Timko | |
| 6,124,818 A | 9/2000 | Thomas et al. | |
| 6,400,302 B1 | 6/2002 | Amazeen et al. | |
| 6,456,220 B1 | 9/2002 | Leung et al. | |
| 6,538,594 B1 | 3/2003 | Somayajula | |
| 6,559,789 B1 | 6/2003 | Somayajula | |
| 6,587,066 B1 | 7/2003 | Somayajula | |
| 6,600,437 B1 | 7/2003 | Confalonieri et al. | |
| 6,603,415 B1 | 8/2003 | Somayajula | |
| 6,667,707 B2 | 12/2003 | Mueck et al. | |

(Continued)

*Primary Examiner*—Tammara Peyton
(74) *Attorney, Agent, or Firm*—Howison & Arnott, LLP

(57) ABSTRACT

DMA controller for mixed signal device. A mixed signal integrated circuit with memory control is disclosed. A data conversion circuit is provided that is operable to receive an analog input signal and convert discrete samples thereof at a predetermined sampling rate to a digital representations thereof as a plurality of digital words. A memory stores the digital words generated by the data conversion circuit. A processor is included on the integrated circuit and operable to access the memory to output select ones of the digital words for processing thereof in accordance with a predetermined processing algorithm. A memory access controller controls access to the memory by the data conversion circuit and the processor. The memory access controller is operable to restrict access to the memory by the data conversion circuit without interrupting the generation of digital words therefrom when the processor is accessing the memory, and allowing access to the memory by the data conversion circuitry when the processor is not accessing the memory, such that the data conversion circuit can transfer currently generated digital words and previously generated and non stored digital words for storage in said memory upon gaining access thereto.

12 Claims, 12 Drawing Sheets

U.S. PATENT DOCUMENTS 6,681,346 B2 * 1/2004 James et al. .................. 714/42
6,701,395 B1 * 3/2004 Byrne et al. .................. 710/69
6,720,903 B2 4/2004 Confalonieri et al.
6,747,589 B2 8/2004 Srinivasan et al.

* cited by examiner

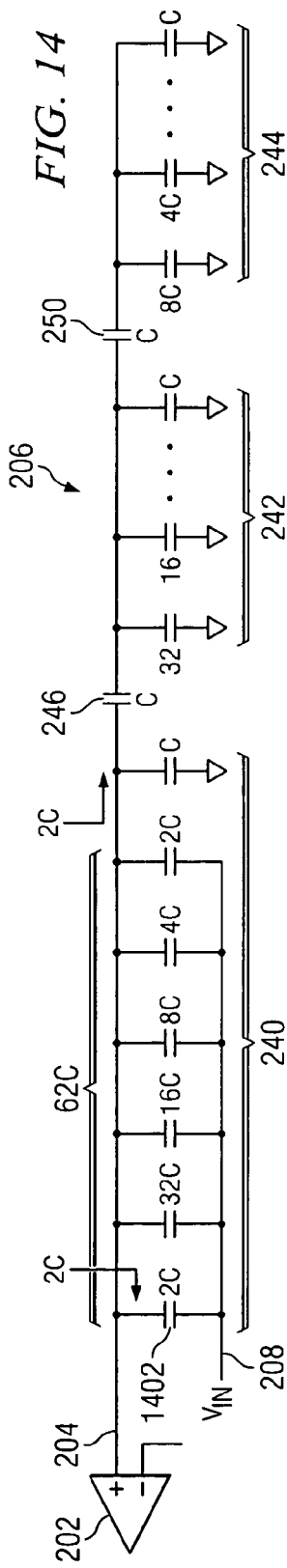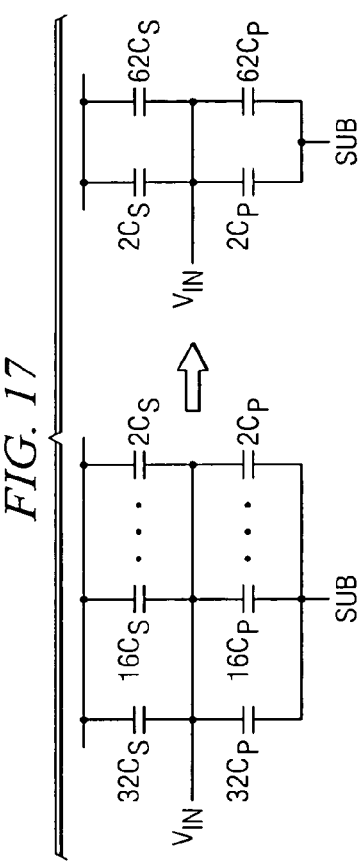

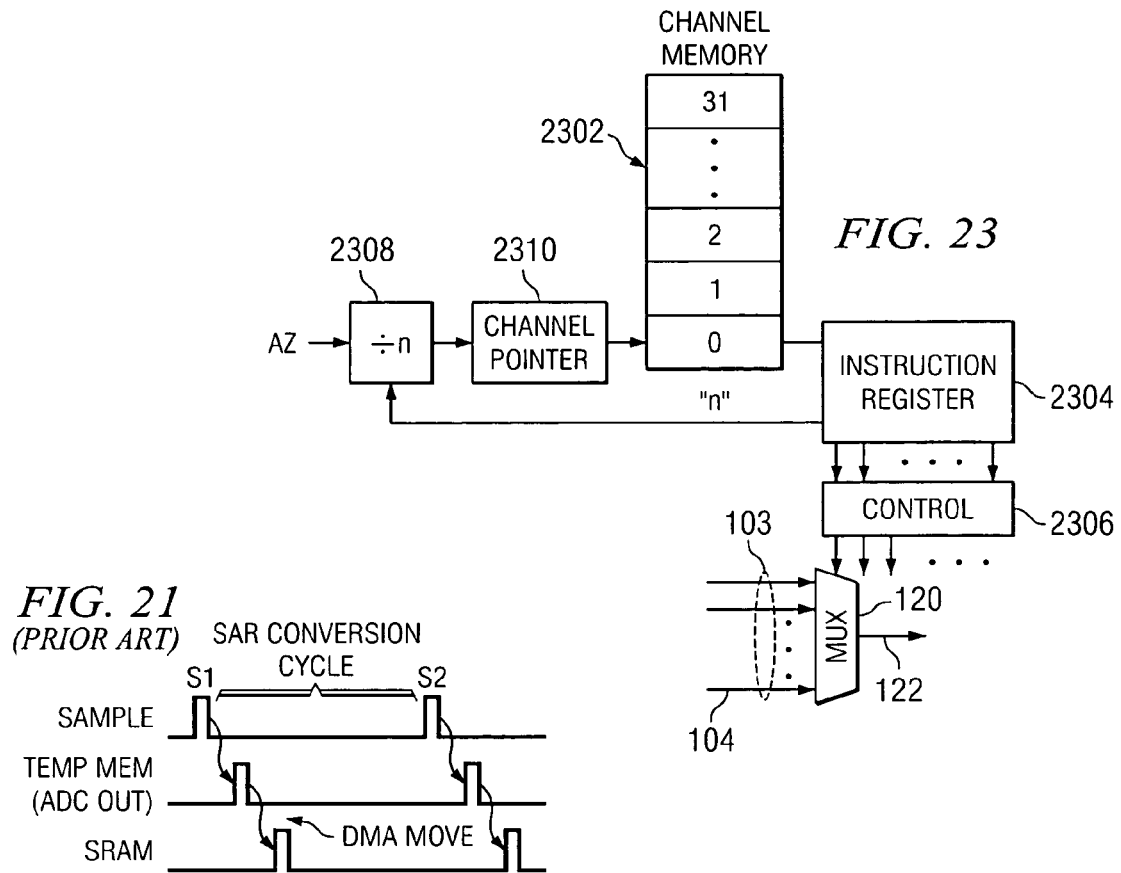
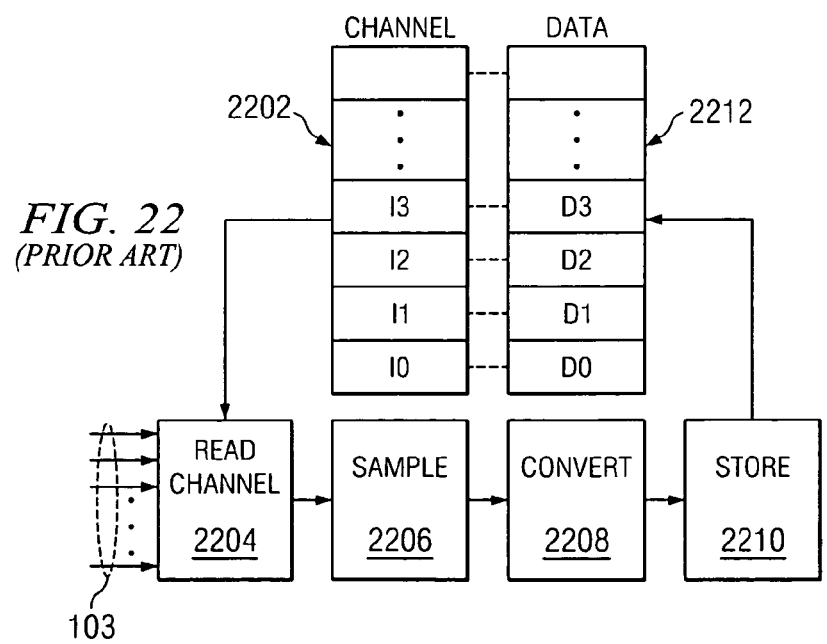

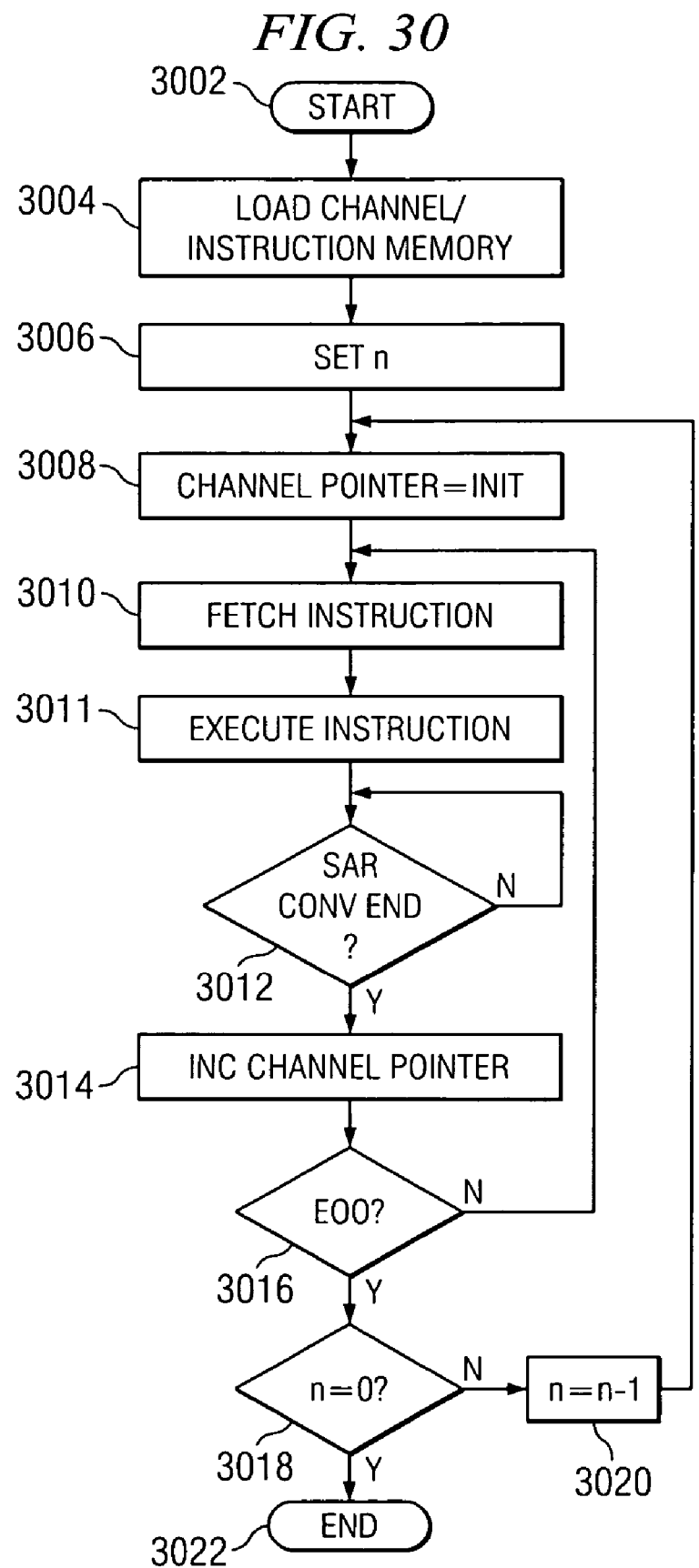

DMA CONTROLLER THAT RESTRICTS ADC FROM MEMORY WITHOUT INTERRUPTING GENERATION OF DIGITAL WORDS WHEN CPU ACCESSES MEMORY

CROSS REFERENCE TO RELATED APPLICATIONS

This application is Continuation-in-Part of U.S. patent application Ser. No. 10/453,369, filed Jun. 3, 2003 now U.S. Pat. No. 6,882,298, and entitled "SAR ANALOG-TO-DIGITAL CONVERTER WITH TWO SINGLE ENDED INPUTS," and is related to co-pending application entitled "NOISE CANCELLATION IN A SINGLE ENDED SAR CONVERTER," Ser. No. 10/753,163; and co-pending application entitled "SAR DATA CONVERTER WITH UNEQUAL CLOCK PULSES FOR MSBS TO ALLOW FOR SETTLING," Ser. No. 10/734,890; and co-pending application entitled "HIGH SPEED COMPARATOR WITH BLOCKING SWITCHES FOR SAR CONVERTER," Ser. No. 10/735,164; and co-pending application entitled "COMMON CENTROID LAYOUT FOR PARALLEL RESISTORS IN AN AMPLIFIER WITH MATCHED AC PERFORMANCE," Ser. No. 10/735,387, all co-pending applications being Continuation-in-Part applications of U.S. patent application Ser. No. 10/453,369, filed Jun. 3, 2003, entitled "SAR ANALOG-TO-DIGITAL CONVERTER WITH TWO SINGLE ENDED INPUTS."

TECHNICAL FIELD OF THE INVENTION

The present invention pertains in general to data converters and, more particularly, to a mixed signal device with both an analog-to-digital converters and a microprocessor disposed on a single integrated circuit and a DMA for controlling memory access.

BACKGROUND OF THE INVENTION

Data converters are provided for receiving either an analog signal for conversion to a digital signal or a digital signal for conversion to analog signal. For conversion of analog signals to digital signals, an analog-to-digital converter is utilized. This is typically facilitated by sampling an analog voltage onto a capacitor array having a plurality of binary weighted capacitors. The capacitors then have the ability to have one plate thereof selectively switched between a reference voltage and ground to redistribute the charge among the capacitors, the switching done in a sequential manner in accordance with a successive approximation algorithm. By selectively switching the plates of the capacitors, and comparing the other plate of the capacitors, which is connected to a common input of a comparator, to a reference voltage, a digital value for the analog voltage sampled at the input can be determined.

A number of problems exist with the data conversion of an analog signal to a digital signal. Some of these problems reside in the various offsets of the inputs to the comparators, one of which is due to the fact that the actual chip ground may be different from the input ground at the PC board on which the actual chip is disposed. Additionally, the capacitors in the capacitor array are weighted and can have errors associated therewith. These errors can be accounted for by actually calibrating each of the capacitors with a sub-capacitor array. However, this calibration must be done at each power up of the A/D convertor. Additionally, these capacitor arrays can also have various parasitics associated therewith that effect the operation thereof and require the driving voltage to drive a higher capacitance value than that associated with the capacitance array.

When the capacitor arrays are operated in accordance with a data conversion algorithm such as a SAR algorithm, during the sampling period, the output node of the capacitor array is typically connected to an input of an amplifier and that input connected to a reference voltage. When operating in conjunction with a differential input amplifier, typically both input nodes thereof are switched to a common mode voltage during the sampling or tracking phase where the input voltage is impressed across the switched capacitors and then switched to the capacitor array thereafter. However, it is important when operating with a single array that noise introduction by the voltage source driving the common mode node or reference node for each of the inputs is cancelled. Unless these are balanced, there will be a noise contribution due to this reference voltage circuit.

After the SAR data conversion, the resulting digital value is locked into a latch, which information then comprises the results of the data conversion, i.e., the digital representation of the analog input value. This is then routed to data memory. In order to incorporate analog-to-digital data conversion circuitry on the same integrated circuit as digital processing circuitry, it is necessary to operate the data conversion circuitry virtually independent of the digital processing operation, so that an analog input signal can be continuously sampled at the same time as the digital processing circuitry is executing instructions. However, the two circuits will typically share a common memory, so that data collected by the data conversion circuitry can be digitally processed by the digital processing circuitry and there typically is only a single databus that allows access to this common memory, unless it is a dual port memory, a more complex and expensive solution. The reason to have a common memory is that the sampling operation with the data converter is operable to sample input signals in accordance with a predetermined sampling program and store this information in predetermined locations in the memory at substantially the same time as they are generated. The processing portion of the integrated circuit, while executing instructions, will in accordance with those instructions access certain locations of the memory for information regarding analog input signals that are sampled. For example, in a controller operation, there may be multiple sensor outputs that are measured on a periodic basis and stored in memory. When the processor desires information about the sensors, all it needs to do is look into the predetermined locations in the data memory. However, access to the data memory for information about the sampled analog values, or access to data memory for other reasons, must be managed to prevent data collisions on the data bus. Typically, a DMA is provided for hat function that, during a data conversion operation, will seize the bus and assert priority thereover at the end of a conversion cycle, wherein this information will be loaded into memory and the digital processing circuitry will be "halted" during that time. This can be a problem when multiple samples of information are collected and stored in the data memory, as once per conversion cycle the memory is blocked and the access by the digital processing circuitry is halted.

SUMMARY OF THE INVENTION

The present invention described and claimed herein, in one aspect thereof, comprises a mixed signal integrated circuit with memory control. A data conversion circuit is provided that is operable to receive an analog input signal and convert discrete samples thereof at a predetermined sampling rate to a digital representations thereof as a plurality of digital words. A memory stores the digital words generated by the data conversion circuit. A processor is included on the integrated circuit and operable to access the memory to output select ones of the digital words for processing thereof in accordance with a predetermined processing algorithm. A memory access controller controls access to the memory by the data conversion circuit and the processor. The memory access controller is operable to restrict access to he memory by the data conversion circuit without interrupting the generation of digital words therefrom when the processor is accessing the memory, and allowing access to the memory by the data conversion circuitry when the processor is not accessing the memory, such that the data conversion circuit can transfer currently generated digital words and previously generated and non stored digital words for storage in said memory upon gaining access thereto.

BRIEF DESCRIPTION OF THE DRAWINGS

For a more complete understanding of the present invention and the advantages thereof, reference is now made to the following description taken in conjunction with the accompanying Drawings in which:

FIG. 14 illustrates a diagrammatic view of the capacitor array illustrating the sampling operation of the input voltage;

FIG. 15 illustrates a cross-sectional view of a capacitor fabricated on a substrate;

FIG. 16 illustrates a schematic diagram of a single sampling capacitor illustrating the association with its parasitic capacitance;

FIG. 17 illustrates a schematic diagram of the use of external compensating parasitic capacitance in accordance with the embodiment of FIG. 14;

FIG. 21 illustrates a timing diagram for the prior art DMA operation;

FIG. 22 illustrates a diagrammatic view of the memory transfer associated with the data conversion operation for a prior art device;

FIG. 23 illustrates a diagrammatic view for the memory transfer operation associated with the present disclosure under the control of the DMA;

FIG. 30 illustrates a flow chart of an alternate mode of operation.

DETAILED DESCRIPTION OF THE INVENTION

Figure 1:
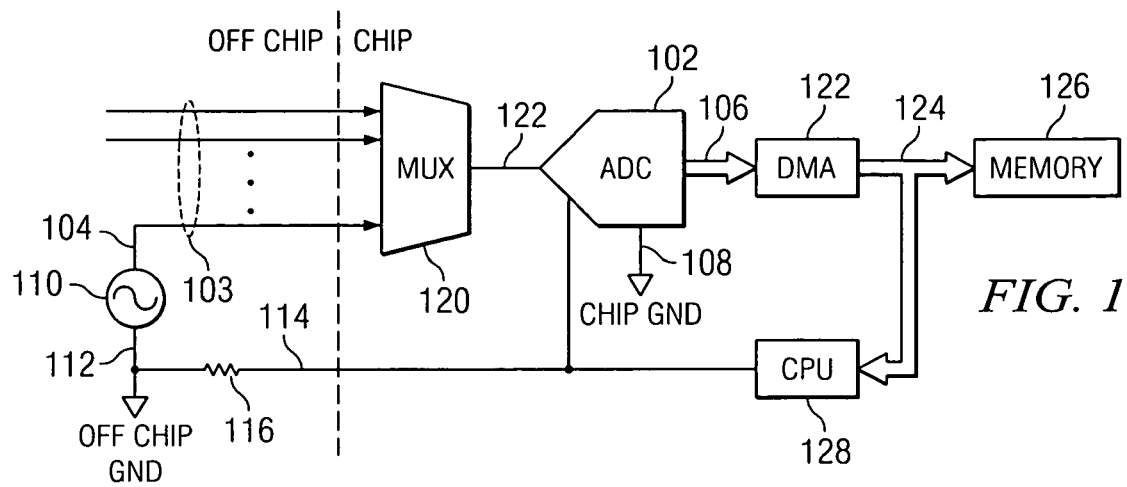
FIG. 1 illustrates an overall diagrammatic view of a mixed signal integrated circuit with an integrated ADC and DMA.

Referring now to FIG. 1, there is illustrated a diagrammatic view of a mixed signal integrated circuit that provides both processing functionality and the ability to sample external analog signals and convert them to digital information for storage on the integrated circuit. The analog signals are represented by a plurality of analog input data lines 103, of which one is illustrated as being connected to an external signal source 110. Signal source 110 is referenced to an off chip ground node 112. This is connected through a resistor 116 to an input ground 114 connection to the integrated circuit, which will be described hereinbelow. The input analog lines are input to a multiplexer 120, which is operable to provide a single analog output 122 that is input to an analog-to-digital convertor (ADC) 102. The ADC 102 is operable to sample the analog signal at predetermined intervals at a predetermined sampling rate and convert the analog value at each sample to a digital value and provide a digital value as an output on a bus 106. This is input to a DMA 122. The DMA 122 is operable to control access to a databus 124 such that the information on the digital bus 106 can be stored in a data memory 126. A CPU 128 is provided on a chip that provides the processing functionality. The CPU 128, during the operation thereof, accesses the memory 126 for reading of data therefrom or writing of data thereto. The ADC 102 is associated with a chip ground 108 that is the ground connection to the ADC 102 in proximity thereto. However, the input voltage on the line 104 typically is derived from the external voltage source 110. Associated with that voltage source 110 is the off chip ground 112 or an off board ground. This ground is connected to the ADC 102 through the ground line 114, this ground line 114 having associated therewith the finite resistivity or resistance 116. As such, the voltage of the off chip ground 112 may actually be different than the chip ground 108. As will be described hereinbelow, this resistance offset in the voltage between the off chip ground input and the signal input on line 104 will be accounted for.

Figures 2, 2A:
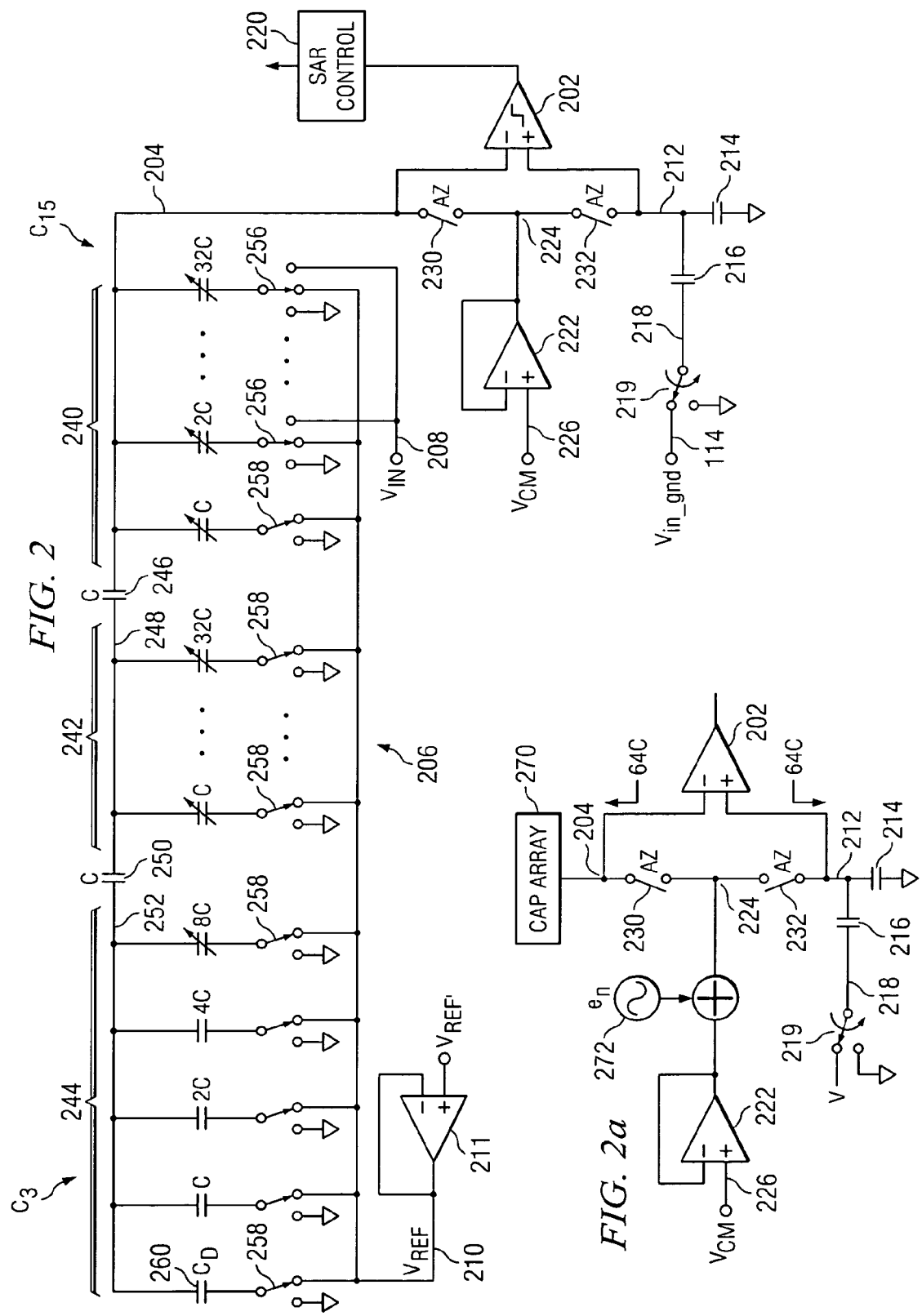
FIG. 2 illustrates an overall diagrammatic view of the pseudo differential ADC of the present disclosure.
FIG. 2a illustrates a detailed schematic diagram of the common mode driver interface.

Referring now to FIG. 2, there is illustrated a schematic diagram of the overall ADC. The ADC is comprised of a comparator section 202 having a positive and a negative input. The negative input is connected to a node 204, which node is connected to a capacitor array 206. The capacitor array, in accordance with a conventional successive approximation algorithm, will have one plate of the capacitors associated therewith connected to an input voltage on an input node 208 or a reference voltage on a node 210 or ground, as will be described in more detail herein below. The reference voltage on node 210 is provided by a reference voltage driver 211 that is operable to receive an input reference voltage $V_{ref}'$ on a positive input, driver 211 having a negative input connected to the output thereof, the output connected to node 210 to provide a voltage $V_{ref}$.

The positive input of the comparator 202 is connected to a node 212, which node 212 is typically, in a single ended operation, connected to ground. However, in the present disclosure, the node 212 is connected to one side of a first capacitor 214, the other side of capacitor 214 connected to ground. Node 212 is also connected to one side of a series or sampling capacitor 216, the other side thereof connected to a switching node 218. Switching node 218 is either switched with a switch 219 to ground or to the voltage input ground on the node 114, this being the ground from the external voltage source 110.

The output of the comparator 202 is connected to a successive approximation register (SAR) control block 220 which is operable to execute the successive approximation algorithm. As is well known in the art, the successive approximation register is operable to first sample the input voltage across all of the capacitors in the capacitor array which, in the present embodiment as will be described hereinbelow actually only provides for sampling the input voltage over only a portion of the capacitors. However, conventional SAR algorithms will sample the input voltage across all of the capacitors. After this, select ones of the capacitors have the bottom plates thereof connected to ground and select ones of the capacitors have the bottom plates thereof connected to the reference voltage node 210 in a predetermined order. This causes redistribution of charge which changes the voltage on node 204. This is compared with a reference voltage and, if the voltage on node 204 is above the reference voltage, then this capacitor has the bottom plate thereof returned to ground. However, if the voltage on node 204 does not rise above the reference voltage, then the voltage from the bottom plate of this capacitor remains at the reference node voltage on node 210. This is a successive operation which sequentially steps through each of the capacitors from the most significant or largest capacitor to the least significant or smallest capacitor. Again, this SAR operation is conventional.

In order to set a reference voltage on node 204, a common mode voltage driver 222 is provided that is operable to drive a node 224, a low impedance, with a common mode voltage, $V_{CM}$, on an input node 226, a high impedance node. The common mode voltage driver 222 comprises a voltage driver having a positive input connected to node 226 and a negative input connected to the output thereof, the output connected to node 224. This is a non-inverting driver. Node 224 is connected via an auto-zero switch 230 to node 204 and via an auto-zero switch 232 to node 212. When the input voltage on node 208 is sampled onto the capacitor array 206, switches 230 and 232, and switch 219, are configured such that $V_{CM}$ is connected to nodes 204 and 212, and switch 219 is connected to node 114 such that the input voltage ground is connected to node 218 and sampled onto the lower plate of the capacitor 216. After sampling the input voltage, switches 230 and 232 are opened and switch 219 is connected to on-chip ground. Since the on-chip ground may be different than the ground reference associated with the input voltage, the input voltage ground, the voltage between $V_{IN}$ and on-chip ground may not equal the voltage between the input voltage $V_{IN}$ and $V_{IN-GND}$. With the operation of the switch 219, this effectively provides an offset at node 212 proportional to the difference between the on-chip ground and the off-chip ground, $V_{IN-GND}$, the proportionality value defined by the values of the capacitors 214 and 216. For example, if the common mode voltage is $V_{CM}$, then the difference between on-chip and off-chip ground, $V_{IN-GND}$, will be multiplied by $C_{216}/(C_{216}+C_{214})$ and added to the node 212. This is referred to a pseudo-differential operation.

The capacitor array is configured as a bridge capacitor array. The bridge capacitor array, in this embodiment, is associated with a 16-bit SAR ADC. This is configured with a bridge capacitor array with three capacitor sections, a capacitor section 240, a capacitor section 242 and a capacitor section 244. Capacitor section 240 is comprised of a plurality of capacitors each having the upper plate thereof connected directly to node 204 and the bottom plates of each of the capacitors in section 240 connected to switched nodes. Capacitor section 240 at node 204 is connected to one side of a series capacitor 246, the other side thereof connected to a node 248. Node 248 is connected to the top plates of a plurality of capacitors associated with capacitor section 242, the bottom plates thereof each connected to individual switched nodes. Node 248 is connected to one side of a series capacitor 250, the other side thereof connected to a node 252 associated with capacitor section 244. Node 252 is connected to the top plates of each of the capacitors in capacitor section 244, the bottom plates of each of the capacitors in capacitor section 244 connected to individual switched nodes.

As will be described in more detail herein below, the capacitors in section 240 range from a high value to a low value. Capacitors are referred to in relationship to a common unitary value "C" that represents a unit capacitance value. The capacitor section 240 has capacitors that are binary weighted and range in value from C to 32C. Each of the capacitors is noted as being calibratable, i.e., each can have the value thereof varied. The binary weighting will result in capacitors arranged in the following sequence: C, 2C, 8C, 16C and 32C. In this embodiment, only the capacitors 2C, 4C, 8C, 16C and 32C have the input voltage sampled thereacross. Therefore, each of the capacitors from 2C through 32C have the bottom plate thereof connected to a switch 256 that can switch between ground, the $V_{ref}$ node and the $V_{in}$ node 208. Thus, $V_{in}$ on node 208 can be sampled across the capacitors from 2C to 32C for capacitor section 240. The capacitor C has the bottom plate thereof connected to a switch 258 that can only be switched between ground and the $V_{ref}$ node 210.

In capacitor section 242, the capacitors range in a binary weighting succession from C through 32C, each of the capacitors therein having the top plate thereof connected to node 248 and the bottom plate thereof connected to an associated switch 258 which, as described hereinabove, can only be connected between ground and the $V_{ref}$ node 210. Capacitor section 244 has binary weighted capacitors that range from C through 8C and a dummy capacitor 260 that has the value of C. The capacitors in section 244 have the top plate thereof connected to node 252 and the bottom plate thereof connected to an associated switch 258 for each capacitor therein that can be connected to ground and the $V_{ref}$ node 210. The operation of the SAR control will be described hereinbelow with respect to the operation thereof.

In addition, although not shown, there is an additional parasitic capacitor that will have the operation thereof described hereinbelow.

Referring now to FIG. 2a, there is illustrated a detailed schematic diagram of the interface of the common mode driver 222 with the inputs to the comparator 202. As noted hereinabove, this is configured as a single ended operation which, in the normal prior art operation, would have one side thereof connected to a fixed voltage such as $V_{CM}$. In that operation, the common mode driver would typically provide the common mode voltage to the negative input on node 204 to apply the common mode voltage to the node 204 during the sampling operation. However, as noted hereinabove, there are provided two switches 230 and 232, which connect the common mode input to both the negative input and the positive input on nodes 204 and 212, respectively. On the reference node, the positive input of the comparator 202, the capacitors 216 and 214 are provided which, in combination, provide a "fixed" capacitance that is substantially equal to the capacitance of the capacitor array, represented by a block 270. The common mode driver, as noted herein, has a high input impedance on the positive input on node 226, and the output on node 224 is a low impedance driver. Inherent to the operation of this common mode driver 222 is the introduction of noise into the output, this represented by a noise generator 272 that is summed with the output of the driver 222. If the output of the common mode driver were only sampled onto the node 204 during the conversion operation, then the noise of the common mode driver would be added to the negative input and there would be no rejection thereof on the input to the comparator 202 and this noise would then be amplified and output on the output thereof. If it was sampled onto the positive input on node 212 and there were no capacitor configuration to sample an input voltage, i.e., there were no switched capacitor structure associated therewith, then this noise could be disposed on that node. However, with the architecture set forth in FIG. 2a, the use of a capacitor structure on the positive input node, i.e., the reference node, that is substantially equal to that of the capacitor array 270, sampling of the noise on the two substantially identical structures will result in cancellation of the noise from the noise generator 272 through the common mode rejection associated with the input of the comparator 202. If the capacitance is not equal, then this will result in an increase in the noise.

Figure 3:
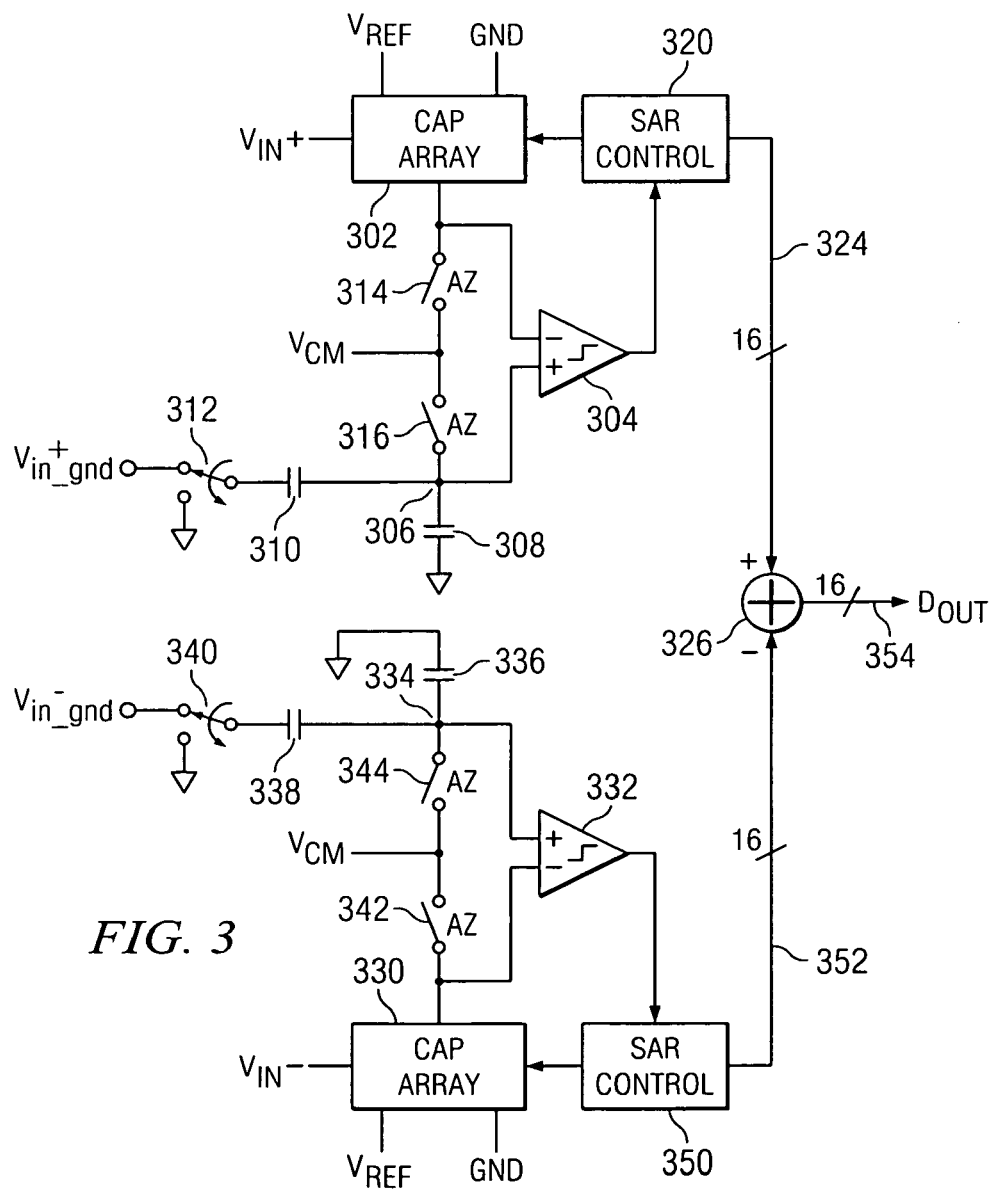
FIG. 3 illustrates a higher level view of the embodiment of FIG. 2 showing a differential input.

Referring now to FIG. 3, there is illustrated a diagrammatic view of a differential configuration utilizing two pseudo-differential SAR configurations. A positive input voltage $V^+_{IN}$ is connected to the input of a capacitor array 302 associated with a comparator 304 and having the output thereof connected to the SAR control 320. The positive input is connected to a node 306, node 306 connected to one side of a capacitor 308, the other side thereof connected to ground and also connected to one side of a sampling capacitor 310, the other side thereof connected to a switch 312 that is operable to be connected to either the off chip input ground, $V^+_{IN-GND}$, or on chip ground. The negative and positive inputs of the comparator 304 are connected to one side of respective switches 314 and 316 for selectively connecting the inputs to a common mode of voltage. Associated with comparator 304 is a SAR control 320 that is operable to perform the successive approximation operation on the capacitor array 302, the capacitor array 302, as described hereinabove with reference to FIG. 2, operable to be connected to either the input voltage $V_{IN}^+$, ground or the reference voltage. The output of the SAR control 320 is connected through a 16-bit bus 324 to a subtraction circuit 326.

The negative input to the overall ADC is provided with a negative input voltage $V^-_{in}$ which is connected to the input of a capacitor array 330, similar to capacitor array 302. Capacitor array 330 is connected to the negative input of a comparator 332, the positive input thereof connected to a node 334. Node 334 is connected through to one side of a capacitor 336, the other side thereof connected to ground and also to one side of a sampling capacitor 338, the other side thereof connected to a switch 340, switch 340 operable to be connected to an on-chip ground or off chip ground, $V^-_{IN-GND}$. It should be noted that $V^+_{IN-GND}$ and $V^-_{IN-GND}$ could be separate voltages to which $V^+_{IN}$ and $V^-_{IN}$ are referenced to or separate ground voltages. Comparator 332 also has the positive and negative inputs thereof connected to respective switches 342 and 344 for selective connection to a common mode voltage $V_{CM}$. The output of comparator 332 is connected to a SAR control block 350 that is operable to perform the successive approximation algorithm in association with the capacitor array 330, as described hereinabove. Capacitor array 330, in addition to receiving as an input of the negative input voltage, also is operable to be connected to either the reference voltage or ground. The output of SAR control 350 is connected to a 16-bit bus 352, which is connected to the negative input of the subtraction circuitry 326. Subtraction circuitry 326 is operable to take the difference between the determined values after the SAR conversion operation and provide a data output on a 16-bit bus 354 that represents the differential voltage value. It should be noted that either of the comparators 304 or 332 could be configured in an inverting configuration such that the subtraction circuit 326 would be an addition circuit, the result of either configuration representing the difference between the digital representations of $V^+_{IN}$ and $V^-_{IN}$.

Figures 4, 5:
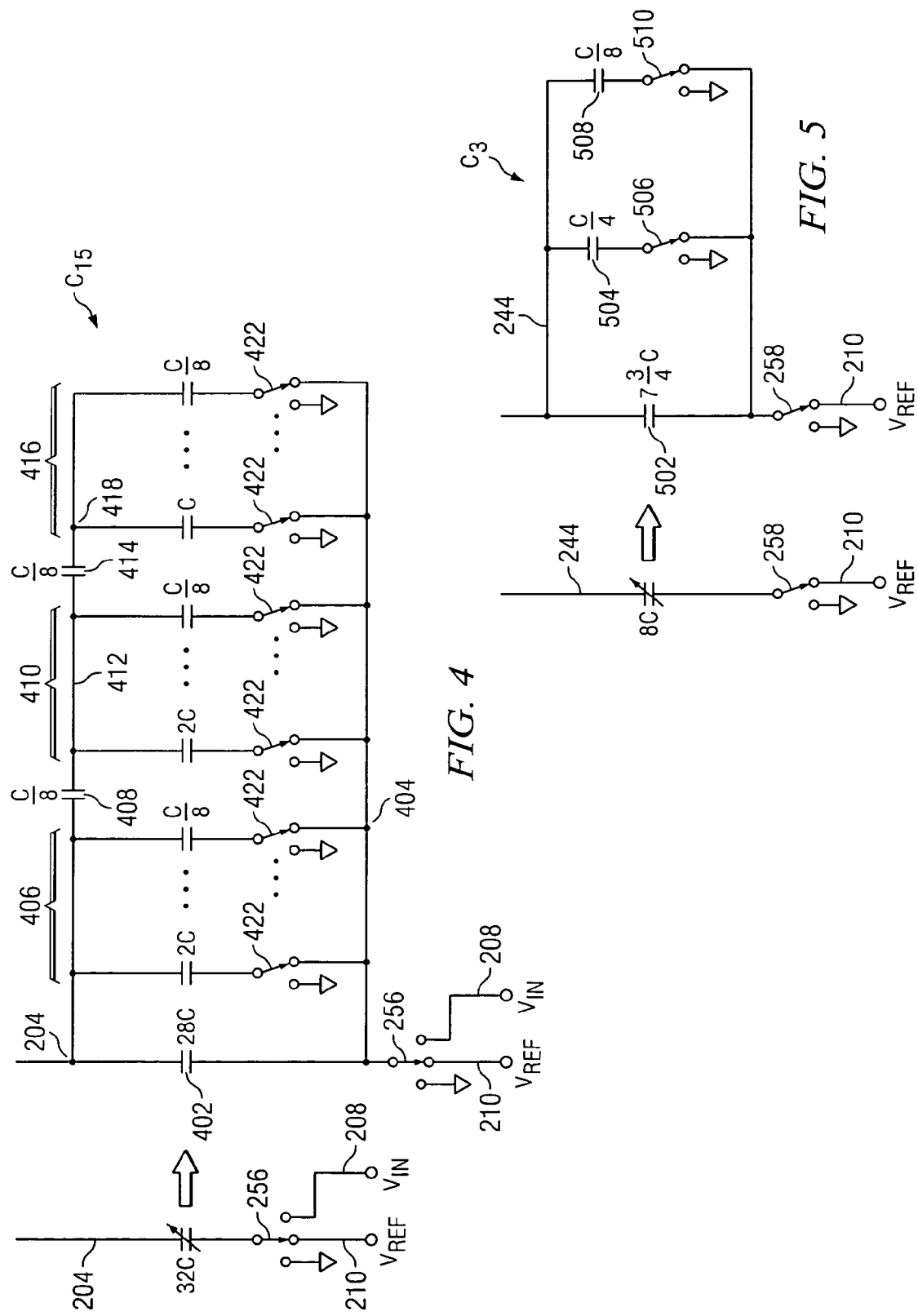
FIGS. 4 and 5 illustrate details of the sub arrays utilized to calibrate each of the capacitors in the capacitor array.

Referring now to FIG. 4, there is illustrated a detail of one of the calibratable capacitors in the capacitor section 240, this being the 32C capacitor therein. This, as described hereinabove, is a calibratable capacitor that can have the value thereof initially varied. In general, capacitors are initially designed to have a binary relationship to other capacitors, the unit capacitance being a value of "C." However, due to manufacturing variations, the capacitive value can have an error associated therewith. This error can be accounted for by providing parallel calibrating capacitors that can be switched in or out in a calibration operation.

In the embodiment of FIG. 4, the most significant capacitor, the 32C capacitor, is illustrated. This capacitor is connected between node 204, the negative input node to comparator 202, and the switch 256. The switch 256, as described hereinabove, is operable to be switched between ground, the reference voltage node 210 or the $V_{in}$ node 208. For calibration purposes, the 32C capacitor, this being the most significant bit (MSB) capacitor, consists of a fixed value capacitor 402 with a value of 28C that is connected between node 204 and switch 256, switch 256 connected to a node 404. Thus, in order to have a value of 32C, there must be a total of 4C that can be connected in parallel with capacitor 402. Further, for calibration purposes, this capacitance value must be larger than 4C to account for values in the capacitor 402 that are in error and smaller than expected due to manufacturing tolerances. Therefore, the calibrating capacitor array connected in parallel with capacitor 402 ranges from a capacitance value as low as C/8 to a value of 2C. This calibrating capacitor array is a bridge capacitor array. This bridge capacitor array is comprised of three sections, a first section 406 comprised of a plurality of binary weighted capacitors that range in value from the largest capacitor of 2C to a capacitive value of C/8 in the following sequence: 2C, C, C/2, C/4 and C/8. Node 204 associated with the upper plate of the capacitors in capacitor section 406 is connected through a series capacitor 408 to a second capacitor section 410 at a node 412 at the top plate of capacitors ranging from 2C through C/8 in a binary weighted configuration. Capacitor 408 has a value of C/8. Similarly, node 412 is connected through a series capacitor 414 to a third capacitor section 416 on a node 418, node 418 connected to the top plate of a plurality of capacitors ranging in value from C to C/8 in a binary weighted configuration. Capacitor 414 has a value of C/8.

Each of the capacitors in the capacitor sections 406, 410 and 416 has the bottom plate thereof connected to a switch 422, switch 422 operable to connect the bottom plate of the respective capacitor to either the node 404 or to ground. During operation, the input voltage on node 208 is not sampled but, rather, all of the capacitors in the entire capacitor array 206 are connected to ground and the common mode voltage to switch 230 connected to node 204 such that the common mode voltage is applied across all of the capacitors. Thereafter, one of the capacitors, i.e., the 32C capacitor associated with section 240, is then individually calibrated. To facilitate this, the switch 256 associated with a particular capacitor (or the switches 258 for the remaining capacitors for remaining two sections 242 and 244) will be switched only between ground and $V_{ref}$ with $V_{ref}$ selected. The switches 422 will then be successively connected to ground through a SAR algorithm, and then a comparison made to balance this overall capacitance out, which balance will only occur when the calibrated value is a real 32C. The general operation of providing calibrated capacitors is described in U.S. Pat. No. 4,709,225, which is incorporated herein by reference.

Referring now to FIG. 5, there is illustrated a diagrammatic view for the 8C capacitor in capacitor section 244, which, as described herein above, is connected between node 244 and one side of one of the switches 258. Also, as noted herein above, the 8C capacitor is comprised of a fixed capacitor 502 of a value 7¾C. To calibrate this, there are provided two capacitors, a capacitor 504 connected across capacitor 502 with a value of C/4 which has one side thereof connected to node 244 and the other side thereof connected to a switch 506 that is operable to connect the bottom plate of capacitor 504 to either ground or to the other side of capacitor 502. Similarly, a second calibrating capacitor 508 has the top plate thereof connected to node 244 and the bottom plate thereof connected to one side of a switch 510 that is operable to connect the bottom plate of capacitor 508 to either the other side of capacitor 502 or to ground. The value of capacitor 508 is C/8. This provides a resolution of ⅛ of the unit capacitance value, C. The calibration will proceed as described hereinabove with respect to the embodiment of FIG. 4.

Figure 6:
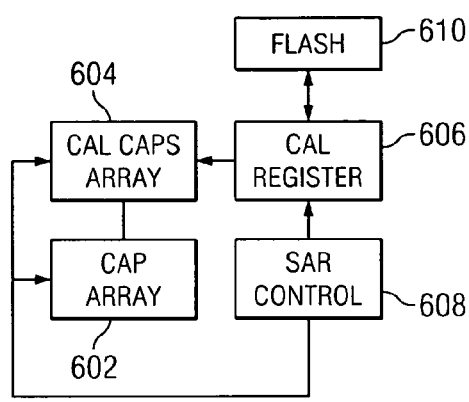
FIG. 6 illustrates the calibration operation and the storage thereof in a flash memory.
Figure 7:
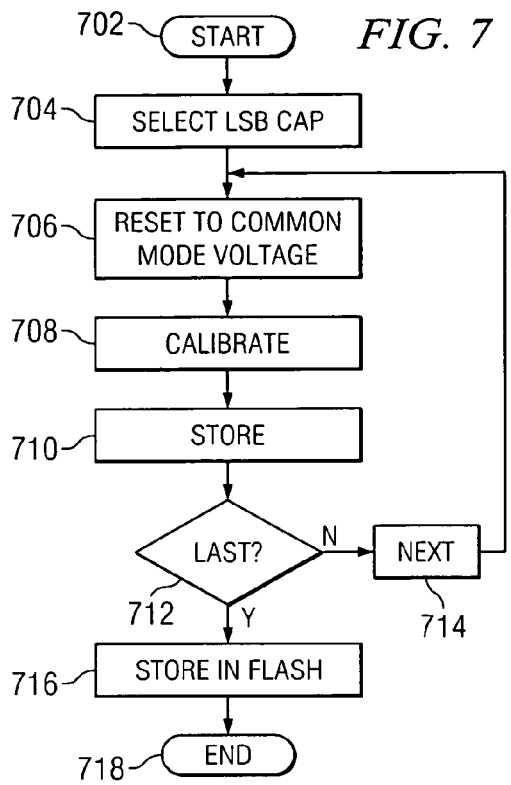
FIG. 7 illustrates a flow chart for the calibration operation.

Referring now to FIG. 6, there is illustrated a diagrammatic view of the calibration operation. Calibration typically occurs on power-up or during production tests. Illustrated in FIG. 6 is a capacitor array 602, which is substantially the capacitor array 206 of FIG. 2. Each of the capacitors in the capacitor array has a calibration capacitor array associated therewith, all of these calibration capacitor arrays represented by block 604. The values of the calibration array switches, i.e., the switches that are connected or disconnected, is set in a calibration register 606. During calibration, a SAR control 608, substantially the same as SAR control 220 of FIG. 2, is operable to control the cap array and the calibration cap array through the calibration register 606 to set the values thereof in the appropriate manner. The SAR control 608 is operable to define these values as described hereinabove. However, once the calibration switch configuration is determined, this information is then stored in a flash memory 610. Therefore, during power up, it is not necessary to go through the calibration operation again; rather, it is only necessary to load the values from flash memory 610. The operation of the embodiment of FIG. 6 is illustrated in a flow chart of FIG. 7, which is initiated at a block 702 and then proceeds to a function block 704 to select the LSB as the least significant bit capacitor for calibration. The program then flows to a function block 706 to reset the input to the comparator 202 at the common mode voltage on the node 204. The program then flows to a function block 708 to calibrate the associated calibration capacitor array associated with that capacitor. The program then flows to a function block 710 to store this value in the calibration register 606 and then to a decision block 712 to determine if this is the last capacitor to be calibrated, i.e., if this is the MSB capacitor. If not, the program flows along the "N" path to a function block 714 to select next capacitor value and then to the input of function block 706 to again reset the comparator 202 at the common mode voltage for calibrating this next capacitor. The program will continue calibrating the capacitors until the last capacitor has been calibrated and then the value of the calibration register 606 stored in flash at a function block 716. This operation is typically done at the manufacturing site when the ADC is placed into a calibration mode. This is facilitated in software and then a command sent, i.e., a Write command, that indicates that the value should be stored. The program then flows to an End block 718.

During operation of the ADC, a power up condition will cause a Read command to be issued to the flash memory 610 to write the values therein to the calibration register 606. However, any nonvolatile memory can be utilized for this purpose and a type of register configuration can be utilized that allows a predetermined set of calibration values to be applied to the calibration arrays associated with this capacitor in a calibration array 206 to accommodate for manufacturing tolerances. Typically, once these manufacturing tolerances have been accounted for, no other changes need be made. This eliminates the need for performing the entire calibration operation at each power up.

Figure 8:
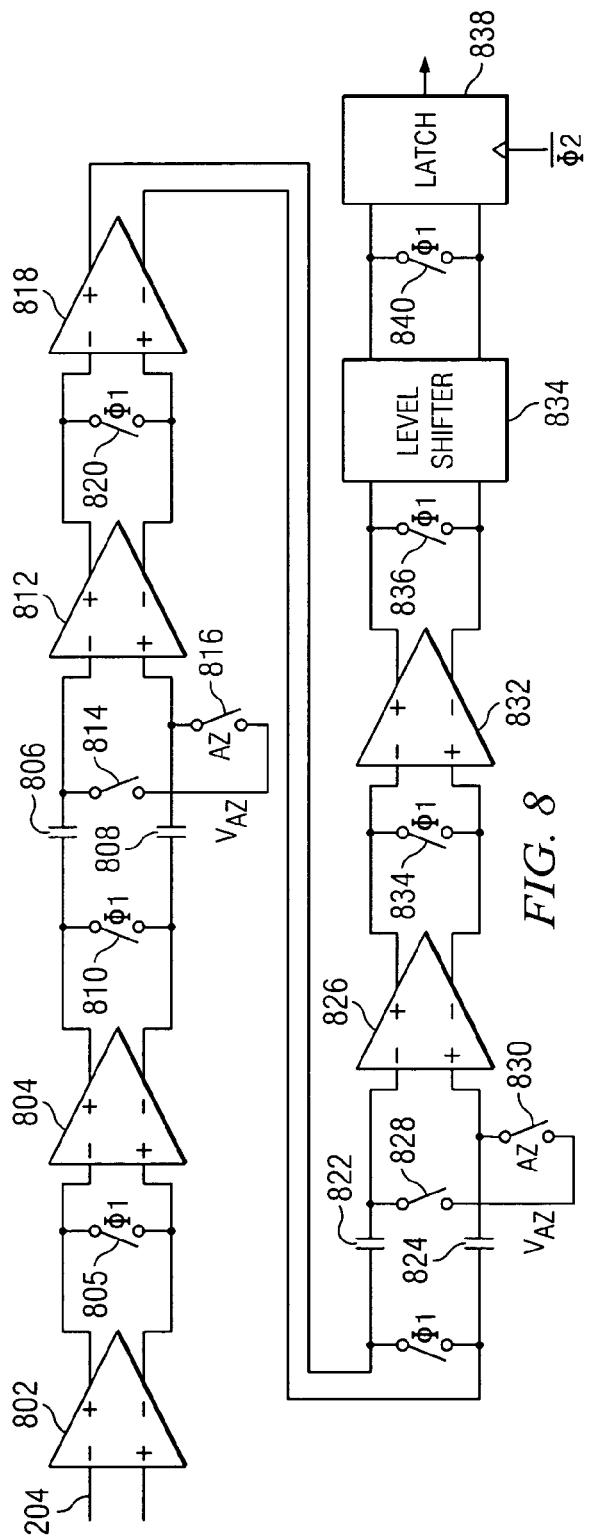
FIG. 8 illustrates a diagrammatic view of the comparator/gain stage and latch.

Referring now to FIG. 8, there is illustrated a diagrammatic view of the comparator/amplifier. A plurality of stages with a comparator are illustrated, there being six stages, each with approximately 9 dB of gain. There is illustrated a first stage 802, which has a negative and positive input, this basically being the negative and positive input associated with nodes 204 and 212 of FIG. 2. The first stage has positive and negative outputs connected to the negative and positive inputs, respectively, of a second stage 804. Additionally, there is provided a switch across the negative and positive inputs of stage 804. This is controlled by a blocking clock signal φ1. The positive and negative outputs of amplifier stage 804 are connected to one side of series capacitors 806 and 808, respectively. A blocking switch 810 is connected between the positive and negative outputs of stage 804. The other side of capacitors 806 and 808 are connected to the negative and positive inputs, respectively, of a third stage 812. Additionally, the negative and positive inputs of the third stage 812 are connected through switches 814 and 816, respectively, to an autozero voltage, $V_{AZ}$. These switches 814 and 816 are controlled by an AZ control signal.

The positive and negative outputs of the third stage 812 are connected to the negative and positive inputs of a fourth stage 818, with a blocking switch 820 connected between the negative and positive inputs of stage 818 and controlled by φ1. The positive and negative outputs of the stage 818 are connected through series capacitors 822 and 824, respectively, to the negative and positive inputs of a fifth stage 826. The negative and positive inputs of fifth stage 826 are connected to the voltage $V_{AZ}$ through respective switches 828 and 830, switches 828 and 830 controlled by the AZ control signal. The positive and negative outputs of stage 826 are connected to the negative and positive inputs of a sixth stage 832, a blocking switch 834 connected across the negative and positive inputs thereof and controlled by φ1. The positive and negative outputs of the sixth stage 832 are connected to the input of a level shifter 834 with a blocking switch 836 connected across the positive and negative outputs and controlled by φ1. The output of level shifter 834 is connected to the input of a latch 838, and having a blocking switch 840 connected across a output of level shifter 834 and controlled by φ1. Latch 838 is controlled by a latch signal φ2-Bar.

Figure 9:
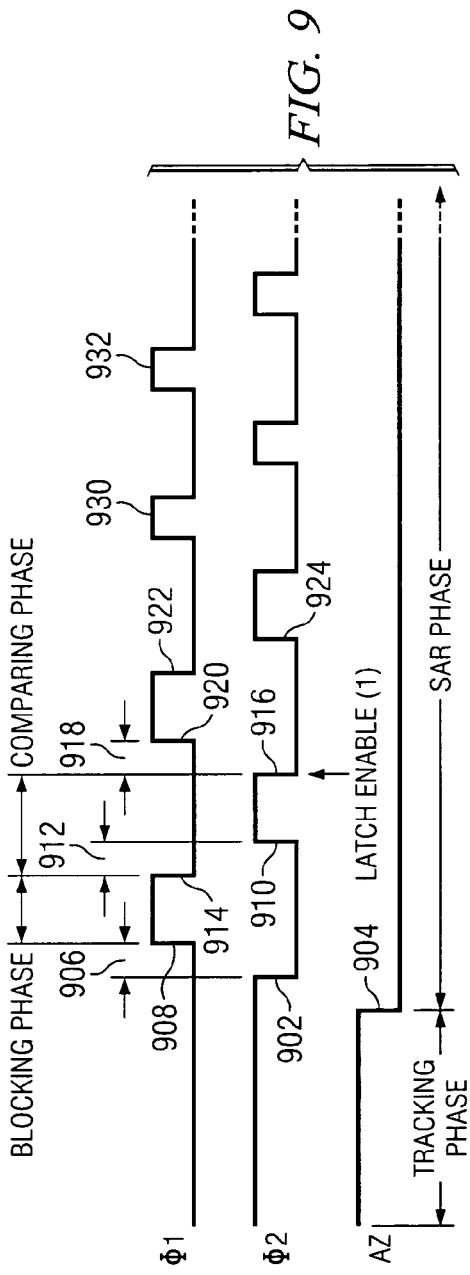
FIG. 9 illustrates a timing diagram for the latching/comparing operation.

In operation, the switches 814, 816, 824 and 830 are all closed during the sampling phase or the "tracking" phase. This is the phase wherein the input voltage is sampled. This essentially puts a preset bias on the input of third and fifth stages, it being remembered that the first stage 802 will have the common mode bias voltage disposed thereacross during this phase. With reference to FIG. 9, there is illustrated a timing diagram for this operation, wherein it can be seen that the control signal AZ is high during the tracking phase and then falls low during the SAR phase. When the tracking phase is completed, the control signal φ2 will go low at an edge 902. The autozero signal, AZ, will also go low at edge 904. This will open the switches 230 and 232, such that the input to the first stage 802 is open with the common mode voltage sampled on the negative and positive inputs thereof. Additionally, the switches associated with the inputs to stages 812 and 826 will also be open such that the voltage $V_{AZ}$ will be on positive and negative inputs thereof. During this time, all of the blocking switches will be opened and will not close until a predetermined delay 906 from the falling edge 902 of φ2. After this amount of delay, all the blocking switches will be closed when φ1 goes high at an edge 908. This will, in effect, prevent any instabilities from occurring that would result from transitions on the input of any of the stages, by reducing the overall gain of the amplifier chain. At rising edge 908, φ1 goes high and the first capacitor will be switched, this being the MSB capacitor. This will be switched in, charge redistributed and then a comparison made. From the rising edge 908 of φ1 to the falling edge 914 of φ2, this time allows the input node 204 to settle and the amplifier chain to stabilize. From falling edge 914 of φ1 to falling edge 916 of φ2, this is the comparing phase of the SAR. At the end of the pulse associated with the rising edge 910, there will be a falling edge 916 that will indicate the end of the comparing phase and it also constitutes a latch enable, i.e., the latch 838 will latch the first bit of the digital value thereof, this constituting the switch setting for the MSB cap. There will be another delay after the falling edge 916, a delay 918 before the next rising edge 920 of φ1. This delay allows the comparator output value from stage 832 to be latched in the latch 838 and then a decision made as to whether that capacitor should remain connected to $V_{ref}$ or ground during the SAR operation. Again, at rising edge 920 of φ1, the blocking switches are closed to again reduce the gain of the amplifier chain and the second capacitor will be switched, this being the MSB-1 capacitor. Note that, after rising edge 920 and before a falling edge 922 on φ1, the blocking phase is again entered and the blocking switches closed to reduce the gain of the amplifier chain. This will set the output of stage 832 to effectively "0" until falling edge 922, wherein the gain will then return to normal and amplify the voltage on the input to stage 802. For example, suppose that prior to rising edge 920, during the comparing phase of the previous SAR operation, that the MSB capacitor was determined to have been left in, i.e., the switch 256 associated with the 32C capacitor in section 240 remain connected to the $V_{ref}$ node 210. This will result in a voltage on the input to stage 802. The rising edge 920 will allow the input to then seek its correct level and settle prior to a rising edge 924 on φ2, at which time the second bit of the SAR conversion phase would be determined.

The φ1 clock will have the first two pulses defined by rising/falling edges 908/914 and 920/922 with a pulse width of 2× the normal SAR clock pulse width (the SAR clock running at ½ normal rate). Thereafter, the pulse width will be a normal pulse width at a normal SAR clock rate, noted by pulses 930, 932, etc. The reason for this is because the first MSB and the second MSB are the largest capacitor values and the longer pulse width allows more time for settling prior to the comparison phase. However, the pulse width is returned to the 1×SAR clock rate to increase the overall SAR clock rate.

It can be seen that there are two aspects that result in the ability to increase the sampling rate of the SAR converter. The first is the use of the blocking pulse, that being the pulse defined by the rising edge 908 and falling edge 914 and the rising edge 920 and the falling edge 922, and also the use of the uneven SAR clock cycle, wherein the length of a cycle is longer for certain bits and shorter for others. Consider the blocking pulse first. By utilizing the switches 805, 810, 820, 834, 836 and 840, the gain of the comparator can be decreased for a predetermined amount of time at the beginning of each switching operation wherein a capacitor is switched between ground and $V_{REF}$. This is where the largest transient pulse will occur. Since the gain is low and the bus bandwidth is high during the blocking phase, the transient pulse will settle out faster and allow the comparison to be accurately made over a much shorter period of time, after which it is latched into the latch 838 by a falling edge of φ2. Further, each successive operation with a smaller capacitor will have an inherently smaller transient, due to the size of the capacitor and the ability of that capacitor to create a transient on node 204. As such, one embodiment results in the pulse width varying over a SAR cycle. For example, the pulse width between rising edge 908 and falling edge 914 can be greater than the pulse width between rising edge 920 and falling edge 922. Similarly, the pulse width for pulses 930 and 932 can also vary in a decreasing manner. This allows the length of time from the time that the capacitors are switched to the time that they can be latched to the decrease for each successive pulse.

With the use of the uneven clock cycles, without the use of the blocking pulse, the ability to increase the sampling rate of the converter is also facilitated. This is due to the fact that the capacitors will be switched at a time prior to the falling edge 916 of the first φ2 pulse and there must be sufficient time to allow node 204 to settle and for the output of the amplifier 832 to settle. Once these have settled, that will complete the comparison phase at the falling edge 916 of the MSB, for example. Thereafter, the settling time for the next capacitor will be less, due to the size of the capacitor.

This will decrease such that the clock cycles are uneven. As illustrated in FIG. 9, only the first two MSB capacitors are considered. However, the uneven clock cycle could only be a single MSB, the second MSB, or a lower bit. Furthermore, it could be a mixture of bits with different clock cycles such that the first two bits had one clock cycle, the second two bits have a second cycle and so on. Therefore, the settling time can be facilitated with either the blocking pulses or the uneven clock cycle or a combination of both.

Figure 10:
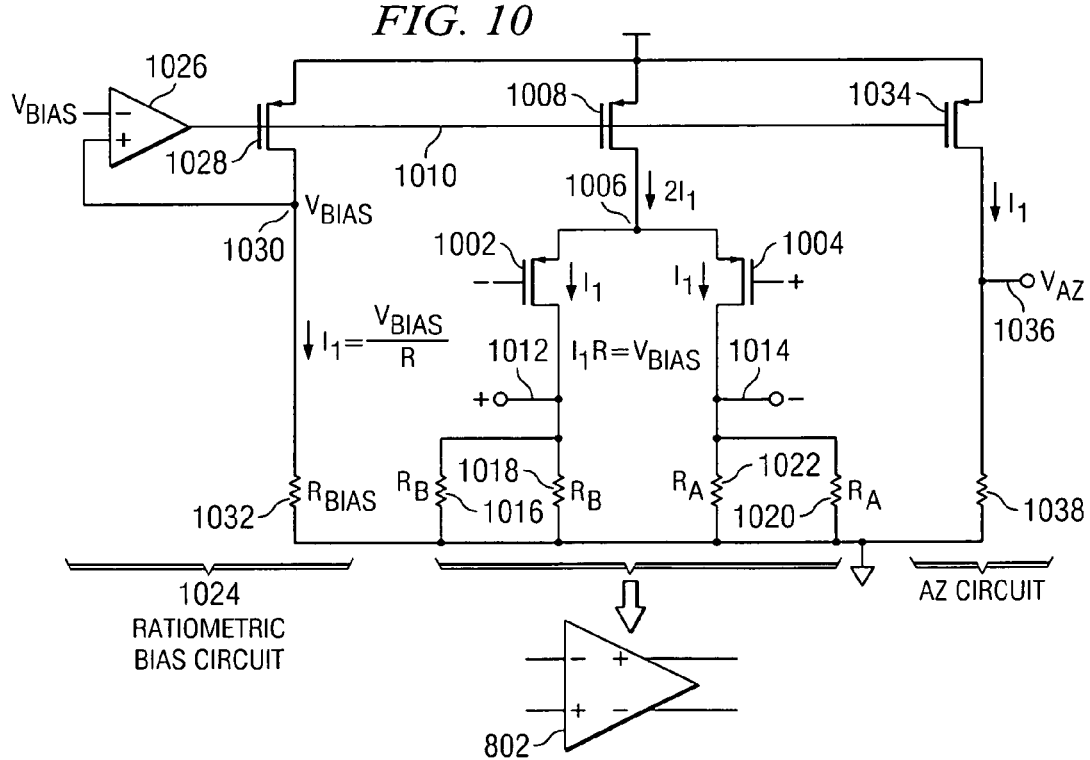
FIG. 10 illustrates a schematic diagram of one stage of amplification and the ratiometric bias circuit associated therewith.

Referring now to FIG. 10, there is illustrated a schematic diagram of one stage of the amplification stage, for example, stage 802. Additionally, there is provided bias circuitry that provides both the voltage, $V_{AZ}$, and a ratiometric bias for both the voltage, $V_{AZ}$, and the stage 802, and subsequently for all of the amplification stages. Each of the amplification stages is comprised generally of a differential pair of p-channel transistors 1002 and 1004 having one side of source-drain paths thereof connected to a node 1006. Node 1006 is connected through the source-drain path of a p-channel transistor 1008 to $V_{dd}$. The gate of transistor 1008 is connected to a bias node 1010. The gate of transistor 1002 is connected to the negative input of the stage 802 and the gate of transistor 1004 is connected to the positive input thereof. The other side of the source-drain path of transistor 1002 is connected to a positive output node 1012 and the other side of the source-drain path of transistor 1004 is connected to a negative output node 1014. Output node 1012 is connected to ground or $V_{ss}$ through two parallel connected resistors 1016 and 1018 and, similarly, a negative output node 1014 is connected to ground through two parallel connected resistors 1020 and 1022.

The bias for transistor 1008 is determined by a ratiometric bias circuit 1024. The bias circuit 1024 is comprised of a voltage driver 1026 having the negative input thereof connected to a bias voltage, $V_{bias}$, the output thereof connected to the gate of a p-channel transistor 1028 having the source-drain path thereof connected between $V_{dd}$ and a bias node 1030. Bias node 1030 is connected to the positive input of the driver 1026 such that the transistor 1028 and driver 1026 provide a voltage follower. The gate of transistor 1034 is connected to node 1010, the source-drain thereof connected between $V_{dd}$ and a node 1036 providing the voltage $V_{AZ}$. Bias node 1030 is connected to ground through a resistor 1032 labeled $R_{bias}$.

In operation, the ratiometric bias circuit 1024 provides a current $I_1$ through resistor 1032 wherein the current $I_1$ is equal to $V_{bias}/R$. The resistors 1016, 1018, 1020 and 1022 are sized such that the current through transistor 1008 delivered to node 1006 is equal to $2I_1$ such that the current through each of the transistors 1002 and 1004 is $I_1$. This results in the fact that the current through each of the resistors 1016, 1018, 1020 and 1022 is I/2 and any variation in the current thorough bias resistor 1032 will be reflected in these resistors 1016–1022. If the value of resistor 1032 increases, the current $I_1$ will decrease both in the bias circuit 1024 and in the stage 802.

In addition to providing bias for the stage 802, the ratiometric bias circuit 1024 also provides bias to determine the voltage $V_{AZ}$. This is provided by driving the gate of a p-channel transistor 1034 with the node 1010. Node 1036 is connected to ground through a resistor 1038, which has essentially the same value as resistor 1032 such that the voltage $I_1$ flows through transistor 1034 and resistor 1038. Therefore, during the tracking phase, the inputs of the first stage 802 and two of the five subsequent stages 812 and 826, have the inputs thereof on transistors 1002 and 1004 connected to a common voltage representing a current balance wherein $I_1$ flows through both of transistors 1002 and 1004.

Figure 11:
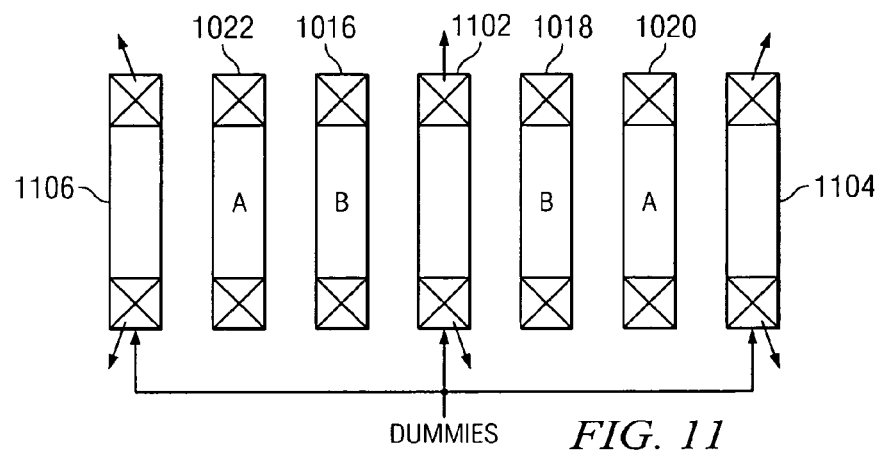
FIG. 11 illustrates a layout of the resistors associated with the amplifier stage.
Figure 12:
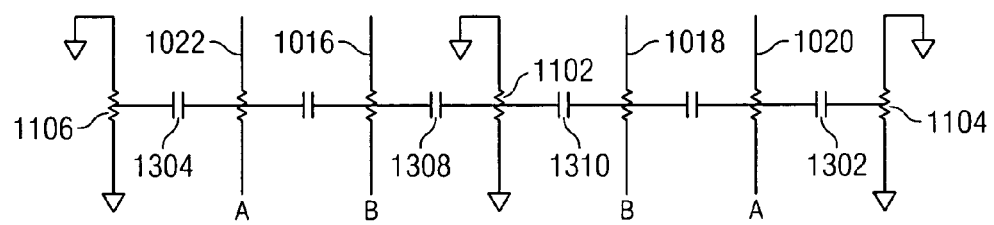
FIG. 12 illustrates a schematic diagram of the resistors illustrating the relationship thereof.
Figure 13:
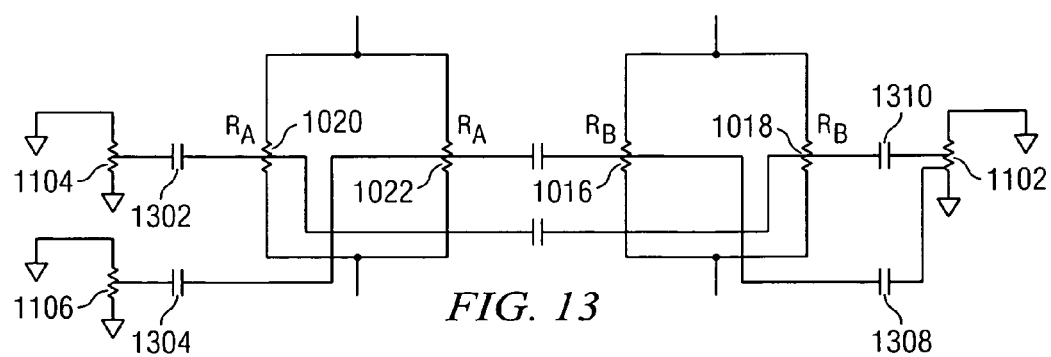
FIG. 13 illustrates an alternate view of the diagram of FIG. 12.

Referring now to FIGS. 11–13, there is illustrated an embodiment relating to the layout of the resistors 1016–1022 to provide a common centroid. The resistors 1016–1022 are fabricated from polycrystalline silicon. This will utilize, during the processing of the semiconductor device for the ADC, the use of one or more layers of polycrystalline silicon (Poly) which can be doped to a predetermined resistivity to provide the appropriate resistance. The resistivity, in addition to the width and length of the "strip" that provides the resistor, will define the value of the resistor.

Referring specifically to FIG. 11, there are illustrated seven resistor strips, all substantially equal. The seven resistor strips are laid out in parallel to each other and comprise the four resistors 1016–1022 with various dummy resistor strips disposed therebetween. In the layout illustrated in FIG. 11, resistors 1016, an $R_b$ resistor and resistor 1022, and $R_a$ resistor, are disposed adjacent to each other, wherein the other $R_a$ resistor 1020 is disposed adjacent to the other $R_b$ resistor 1018. The resistors are laid out, such that resistor 1022 is to the left of resistor 1016, which is to the left of resistor 1018 with a dummy resistor 1102 disposed therebetween. Resistor 1018 is to the left of resistor 1020. Resistor 1020 has a dummy strip 1104 disposed to the right thereof and resistor 1022 has a dummy resistor strip 1106 disposed to the left thereof. Dummy resistor strips 1102, 1104 and 1106 are substantially identical to the resistor strips associated with resistors 1016–1022, with the exception that they are connected to ground.

Referring specifically to FIG. 12, there is illustrated a schematic layout of the resistor strips illustrated in FIG. 11. The dummy resistor strips 1102–1106 are all grounded and it can be seen that the capacitance loading on each of the resistor strips is substantially even. Prior art systems utilize the two dummy strips 1104 and 1106 but not the center dummy strip 1102. The purpose for this layout is to reduce a degradation of the common mode rejection ratio (CMRR). Thus, the capacitive couplings of the resistor strip associated with $R_a$ to $R_b$ or to a dummy resistor strip equals the capacitive coupling of the resistor strip associated with the $R_a$ or the dummy resistor strip. The purpose of coupling each of the resistors to the dummy resistor strips 1104, 1106 and 1102 can be seen in FIG. 13. In prior art systems, only the resistors 1020 and 1022 were coupled to the dummy strips 1104 and 1106 via a distributed capacitive coupling, these represented by capacitors 1302 and 1304. Since the resistors 1020 and 1022 are at the same potential, capacitive coupling there between is not important. However, although there is capacitive coupling between the resistors 1016 and 1018, and 1020 and 1022, what did not exist in the prior art was coupling from the resistors 1016 and 1018 to a centroid dummy strip. This is provided by capacitive coupling of capacitor 1308 and 1310 to dummy strip 1102.

Referring now to FIG. 14, there is illustrated a diagrammatic view of the capacitor array 206. In this embodiment, the configuration during tracking is illustrated wherein $V_{in}$ is connected from node 208 to the switch 256 and the remaining switches 258 all connected to the ground. As noted herein above, in the section 240, only the capacitors 32C through 2C are connectable to the node 208, wherein the capacitor "C" is only connectable to ground and $V_{ref}$. Due to the construction of the bridge, all capacitors from the capacitor "C" and lower, through sections 242 and 244, will result in a total effective capacitance of 2C. Therefore, the total capacitance of section 240 that is connectable to $V_{in}$ will be 62C. As will be described herein below, in addition to the capacitance 62C, there is additionally a parasitic capacitance associated therewith that must be driven by $V_{in}$.

Referring now to FIG. 15, there is illustrated a cross-sectional view of one of the capacitors. Each capacitor is comprised of two plates, one plate formed in a first Poly layer as a plate 1502, which plate 1502 is disposed a predetermined distance above a substrate 1504 and separated therefrom by an insulator. As such, there will be associated therewith a capacitance 1506, this being referred to as a parasitic capacitance, $C_p$. The capacitor is formed with a second plate 1508 separated from the first plate 1502 by a predetermined distance with a dielectric material such as silicon dioxide. This forms the sampling capacitor 1510, $C_s$. The size of this capacitor is a function of the area which can be scaled depending upon the relative ratio thereof with the unit capacitance, C. The equivalent circuit of this is illustrated in FIG. 16.

In FIG. 16, it can be seen that, when the lower plate of all of the sampling capacitors is connected to $V_{in}$, one plate of the parasitic capacitors is also connected to $V_{in}$. Therefore, $V_{in}$ must drive the parasitic capacitance associated with each capacitor that is connected thereto. If, as in conventional SAR conversion operations, $V_{in}$ were sampled across all of the capacitors, which is required for later redistribution of charge, then this $V_{in}$ would have to drive all of the capacitors in the bridge configuration.

With further reference to FIG. 14, it can be seen that section 240 has a total of 64C associated therewith and section 242 has associated therewith a total of 64C. In addition, section 244 has associated therewith a total of 16C. However, the total capacitance contribution for sections 242 and 244 due to the bridge configuration is only C. As such, to eliminate all the parasitic capacitance associated with sections 242 and 244, which would be a total of 82C, it is only necessary to drive a separate capacitor 1402 of a value of 2C that is disposed between node 204 and node 208 when connected. Thus, the parasitic capacitance for the combination of sections 244 and 242 and the lowest value capacitor C in section 240 would be replaced by a single parasitic capacitance of $2C_p$. This capacitor 1402, after sampling, has the lower plate thereof connected to $V_{ref}$ to redistribute the charge to the capacitors that were originally switched to ground in the sections 242 and 244 and the one capacitor in section 240.

With reference to FIG. 17, there is illustrated in a diagrammatic view the capacitor array, wherein the left side of FIG. 17 illustrates that the portion of section 240 connected to $V_{in}$ would result in a total sampling capacitance of $62C_s$ and the total parasitic capacitance would be $62C_p$. All that is necessary to add to this capacitance for the purpose of sampling the input voltage is $2C_s$, which would result in a total of $2C_p$ added thereto.

Figure 18:
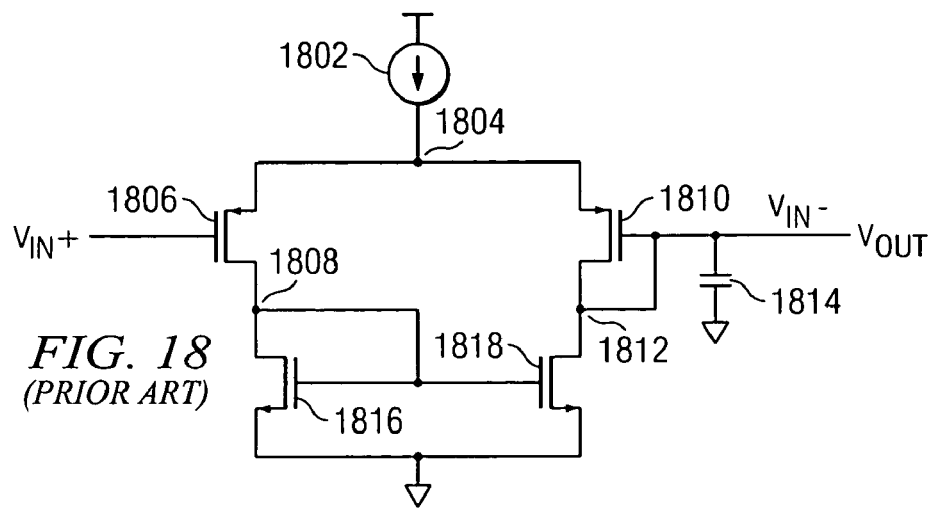
FIG. 18 and FIG. 19 illustrate prior art common mode current drivers.
Figure 19:
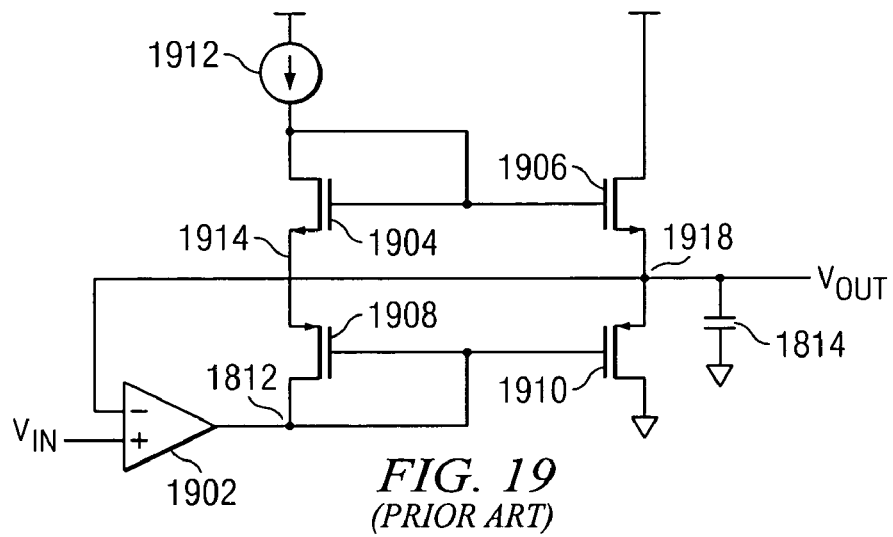
Figure 20:
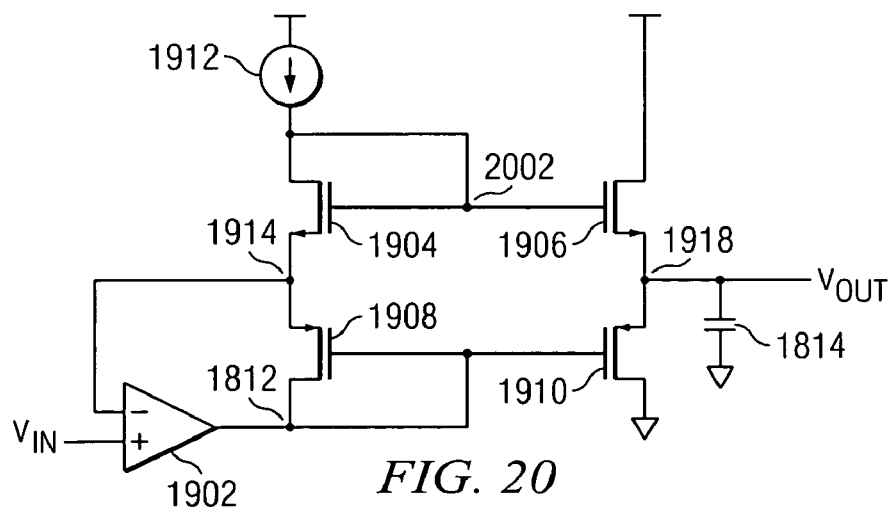
FIG. 20 illustrates the open-loop common mode driver of the present disclosure.

Referring now to FIGS. 18–20, the details of the common mode driver 222 will be described. With specific reference to FIG. 18, there is illustrated a prior art closed-loop driver, this being a fairly straightforward and conventional driver. A current source 1802 is connected between $V_{DD}$ and a common driving node 1804. Node 1804 is connected to one side of the source/drain path of a p-channel transistor 1806, the other side thereof connected to a node 1808. The gate of p-channel transistor 1806 comprises the positive input to the amplifier. The node 1804 is also connected to one side of the source/drain path of p-channel transistor 1810, the other side thereof connected to a node 1812. The gate of transistor 1810 comprises the negative input thereof and is diode-connected to the node 1812, the node 1812 comprising the output voltage $V_{OUT}$. The output voltage $V_{OUT}$ is illustrated as being connected to one side of a capacitor 1814, the other side thereof connected to ground.

Node 1808 is connected to one side of the source/drain path of an n-channel transistor 1816, the other side thereof connected to ground and the gate thereof diode-connected to the node 1808. The node 1812 is connected to one side of the source/drain path of an n-channel transistor 1818, the other side thereof connected to ground and the gate thereof connected to the gate of transistor 1816 and node 1808.

In operation, the output driving the capacitor 1814 must drive node 1812, the $V_{OUT}$ node, through transistor 1810 when current is being sourced to the capacitor 1814. This must pass through the current source 1802 which will limit the amount of current driven thereto. If the slew rate is increased, then more power is required, since the slew rate is defined by the equation:

$$dV_{OUT}/dt = I/C_{LOAD}$$

where $C_{LOAD}$ is the capacitor 1814 and I is the current through the current source 1802.

Referring now to FIG. 19, there is illustrated a variation of the prior art embodiment of FIG. 18, with an amplifier 1902 illustrated that basically is the amplifier of FIG. 18 with the exception that the gate of transistor 1810 is not connected to the output node 1812. The positive input comprises the gate of transistor 1806 and the negative input comprises the gate of transistor 1810. The output is node 1812. This embodiment of FIG. 19 is configured with a complimentary output stage. The complimentary output stage is comprised of two n-channel transistors 1904 and 1906 and two p-channel transistors 1908 and 1910. A current source 1912 drives one side of the source/drain path of transistor 1904 from $V_{DD}$, the gate of transistor 1904 connected to the output of the current source 1912 in a diode-connected configuration. The other side of the source/drain path 1904 is connected to a node 1914, node 1914 connected to one side of the source/drain path of transistor 1908, the other side thereof connected to the node 1812. The gate of the p-channel transistor 1908 is connected to node 1812 in a diode-connected configuration. The n-channel transistor 1906 has the source/drain path thereof connected between $V_{DD}$ and an output node 1918, the gate thereof connected to the gate of transistor 1904. The p-channel transistor 1910 has the source/drain path thereof connected between the node 1918 and ground and the gate thereof connected to the gate of transistor 1908.

In operation, the voltage on node 1918 is maintained at substantially the same voltage on the $V_{IN}$ positive node of amplifier 1902. Since amplifier 1902 is a high gain amplifier, the output on node 1918 is maintained substantially equal to the input voltage. The voltage on node 1918 is mirrored to the node 1914, since the gate-to-source voltage across transistor 1906 is the same as that across transistor 1904, transistors 1904 and 1906 matched. Similarly, the gate-to-source voltage across transistor 1910 is that same as that across transistor 1908. If the voltage on node 1812 rises, this will pull the voltage on node 1914 high, which will pull the gate of transistor 1904 high which will subsequently pull node 1908 higher. This, again, is a conventional prior art complimentary output stage. In general, there is a pole at the node 1812 and a pole at the node 1918. With a large capacitive load, the pole 1918 will be the dominant pole. This will therefore require the amplifier 1902 to be very fast.

Referring now to FIG. 20, there is illustrated a schematic diagram of the open-loop driver of the present disclosure. In this embodiment, the amplifier 1902 is provided for driving the node 1812. The transistors are substantially identical for a complimentary output stage. Therefore, common numerals for like devices are utilized in the two figures. The primary difference is that the negative input to amplifier 1902, that being the gate of transistor 1810, is connected to node 1914 and not to the node 1918. Therefore, the negative input is now isolated from the node 1918 that drives the capacitor 1814. The prior art amplifier of FIG. 19 has a problem in that there is a phase shift that is a function of the capacitor value which is fed back to the negative input of amplifier 1902. As the capacitor value varies, this phase shift will vary and the bandwidth of the feedback loop varies, this providing stability problems and speed problems with the amplifier. This is only a problem where one has a large load such as that associated with a switched capacitor array wherein the capacitors are the total capacitance in the array. By isolating the feedback path from the capacitor 1814 on the output, this essentially fixes the phase shift, thus providing a known level of stability and a high speed operation even with a large capacitor array. It can be seen that the voltage on node 1914 is the same as the voltage on node 1918, as the gate-to-source voltage between node 1914 and the gate of transistor 1904 on a node 2002 is the same as the gate-to-source voltage across transistor 1906 between node 2002 and 1918. The gate-to-source voltage across transistor 1908 between nodes 1914 and 1812 is the same as the gate-to-source voltage across transistor 1910 between nodes 1812 and 1918. Thus, the voltage on node 1918 is effectively fed back to the negative input of amplifier 1902. As to the poles, node 1914 is not loaded with a large capacitor and, therefore is not necessarily the dominant pole. As such, there is no requirement for the amplifier to have a high speed operation to achieve stability.

FIG. 21 illustrates a timing diagram depicting the operation for a prior art system wherein data is sampled by the data conversion device, transferred to temporary memory, such as the latch 838 of FIG. 8 at the end of a SAR data conversion cycle and then transferred from the temporary memory to the main memory. The sample operation is illustrated with two samples, S1 and S2. Sample S1 is present at the end of a previous SAR conversion cycle, after which the contents of the latch 838 are transferred to a temporary memory, this memory being a holding register of some sort. This, of course, could be the latch 838 also, it being noted that the latch 838 must be cleared prior to the next SAR conversion cycle being completed though. The next SAR conversion cycle will then begin after another tracking phase wherein the input voltage is being sampled across the capacitor array. After the first sample is taken, it is transferred to the temporary memory and then immediately to the main memory. This occurs immediately after the final result, i.e., the digital value having been determined that is representative of the input voltage that was sampled. This operation requires, in the prior art system, that the DMA have priority over the databus. With this priority, the CPU operation is halted in a mixed signal device, such that the data transfer is facilitated by the DMA regardless of the operation or operations being performed by the CPU. If the sampling operation, for example, requires 1,000 samples to be taken of input data, then after every conversion cycle, data will be transferred to the main memory by the DMA. This results in the CPU being idled for a portion of the time therein.

Referring now to FIG. 22, there is illustrated a diagrammatic view of the DMA transfer operation during sampling in a mixed signal device for a prior art system. The sampling operation is facilitated through the use of a plurality of instructions stored in a channel/instruction memory 2202. The memory 2202 has a plurality of memory locations, each associated with an instruction. These are labeled I0, I1, I2, I3, . . . , each providing configuration information for the data conversion operation, such as a selection of which channel or channels the multiplexer 120 will select. For example, it may be that an instruction requires a sample to be taken of Channel 1. This instruction as a configuration or control word would be loaded into a memory location. When this instruction is executed, the multiplexer is configured at the beginning of a SAR conversion cycle. The operation is illustrated diagrammatically wherein the instruction goes to block 2204 that is operable to read one of the plurality of channels on the input signal lines 103. This selected line or these selected lines are then input to the ADC 102 for sampling in a sample block 2206 and then conversion in a data conversion block 2208, it being noted that these blocks 2206 and 2208 are provided for illustrative purposes only as representative of the operation of the ADC 102. Once the conversion operation is complete, it is then placed into a temporary storage location, as indicated by a storage block 2210. This information is then transferred to a memory location in a data memory 2212. It is noted that each instruction in this embodiment will result in one data result. Therefore, the channel memory 2202 must be the same size as the data memory 2212, with respect to the number of addressable locations. However, it could be that the length of the data word and the length of the instruction word are different.

In some situations in the prior art system, it is desirable to take a multiple number of samples of a given input channel. With the prior art system, this requires there to be one instruction per data conversion operation. Thus, if 100 samples are required for a single channel with the same configuration, the same instruction must be repeated 100 times. Therefore, the Read pointer for the channel memory 2202 would be incremented from the initial value for instruction I0 through the instruction I99, all of these instructions being identical. They would correspond to data locations, for example, of D0 through D99 in the data memory 2212. Upon power up, the instructions for the sampling operation, which are typically defined by the user depending upon the environment of the application, etc., will be loaded from non-volatile memory such as flash memory to the channel/instruction memory 2202. Depending upon the number of samples for a given operation, there will have to be a large number of instructions loaded into the channel memory 2202. There could be thousands of instructions that must be carried out on a periodic basis. For example, if it will be required to sample all of the input sensors every two second, then the instructions stored in the channel memory 2202 would be initiated at the appropriate time and all of the samples taken and the resulting data stored in the data memory 2212. Again, for each instruction carried out, data must be transferred to the main data memory along a priority basis.

Referring now to FIG. 23, there is illustrated a block diagram for the channel memory of the present disclosure. A channel memory 2302 is illustrated having a finite number of memory locations, there being 32 locations illustrated therein, from location "0" through location "31." However, it should be understood that other sizes of memory could be facilitated. The output of channel memory 2302, for any location address, will output an instruction that is stored therein. This instruction will be stored in an instruction register 2304. The instruction will result in control bits that are output to a configuration device 2306 that will configure the operation of the system for data conversion, etc., for the time that the instruction resides in the instruction register 2304. One control signal will be associated with the multiplexer configuration, this being multiplexer 120. Although illustrated as a single control line, there would be multiple bits to define the configuration thereof. This will result in one or more input signal lines being routed to the ADC 102. As noted herein, the ADC 102 is comprised of two single-ended data converters, such that a single one of the single-ended data converters could be utilized or the operation could involve the differential pair. This was described hereinabove. This, of course, depends upon the sample requirements. For the differential operation, the multiplexer will have one output for each ADC input—two in this case.

In the present disclosure, an additional value provided by an instruction is the number of times that an instruction is to be repeated. Rather than loading a plurality of the same identical instruction within the instruction register and then just incrementing the address pointer, a decrementer 2308 is provided that is operable to increment the channel pointer, indicated by block 2310, only once every "n" data conversion cycles for a Read operation, i.e., when the value of AZ goes high indicating the end of a SAR conversion cycle. Therefore, if there are required to be 100 samples of a given input or a given configuration, only one instruction needs to be loaded into the instruction register 2304 and then it is maintained therein until the decrementer 2308 decrements the decrementer by the value by "n" at which time the channel pointer 2310 will be incremented to the next addressable location in the channel memory 2302. The operation continues until a value stored in the instruction register of "EOO" occurs, indicating an end of the instruction sequence operation. This can then result in a cycle back to the input, such that a continuous program can be run for sampling.

Figure 24:
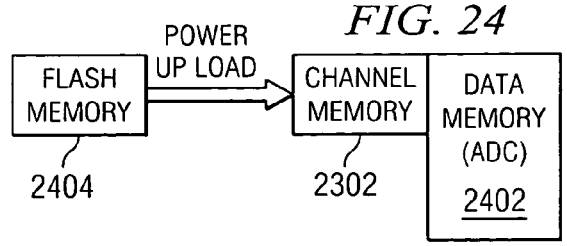
FIG. 24 illustrates a diagrammatic view of the upload of instructions to the channel memory.

Referring now to FIG. 24, there is illustrated a diagrammatic view wherein the channel memory 2302 is compared to the size of the portion of the data memory 126 associated with the ADC storage, this being a memory area 2402. The ADC memory 2402 can be significantly larger than the channel memory 2302. For example, if there were five channels that needed to be sampled for 1,000 sequential samples (or even an interlaced number of samples), there would only need to be one instruction for 1,000 addressable locations in the ADC data memory 2402. Thus, the instructions can be stored in channel memory 2302 from a flash memory 2404 during power up, such that they can be executed thereafter. The user can store this instruction set and sequence in the flash memory 2404 such that, upon power up, the integrated circuit is paramaterized for the sampling operation. It can be seen that, if the number of instructions were required to equal the number of addressable data locations for storage of data in the case where each data conversion operation is associated with a separate instruction, the flash memory 2404 would require significantly more area. The flash memory is more valuable from the standpoint of cost and the surface area required than that associated with on-board SRAM associated with the channel memory 2302. Thus, by reducing the number of addressable locations required for the channel memory 2302, this also directly reduces the amount of flash memory space required in the flash memory 2404 for loading therein of instructions associated with the sampling operation.

Figure 25:
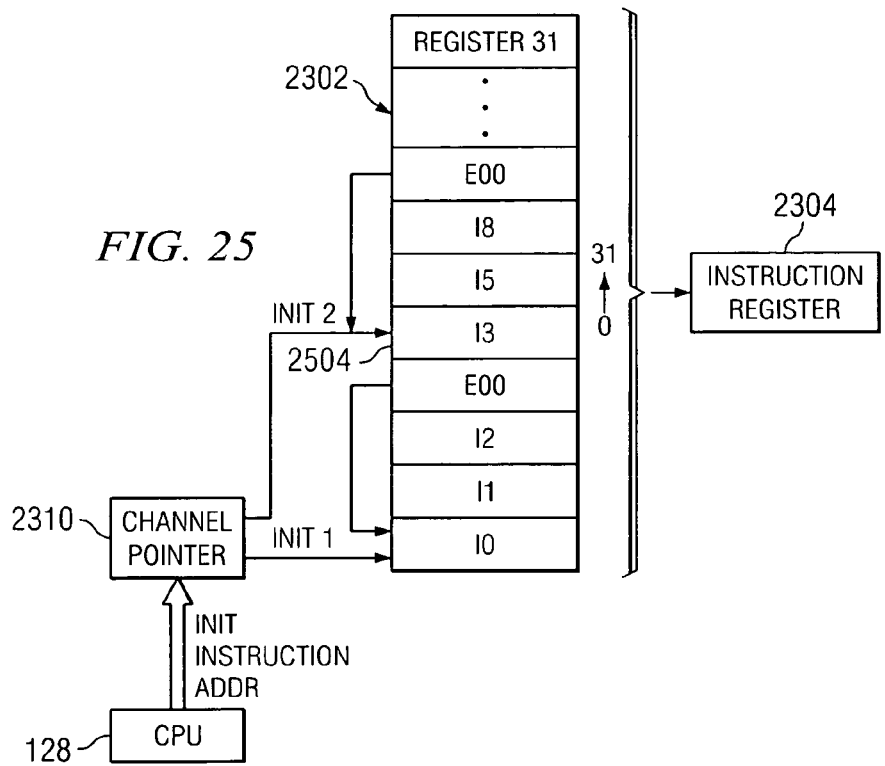
FIG. 25 illustrates a diagrammatic view of the channel/instruction memory with segmented sections.

Referring now to FIG. 25, there is illustrated an alternate embodiment for the sequence of instructions that can be stored in the channel memory 2302. In this embodiment, the memory is divided into a plurality of sections. In the first section, there are illustrated three instructions for a given program, instructions I0, I1 and I2. They are initially executed by setting the channel pointer to an initial value of "000" and then fetching the first instruction, which then results in the channel pointer being incremented for the next instruction. When the final instruction is sequenced, the instruction EOO is output, resulting in a reset of the channel pointer 2310 to the initial value, this being INIT 1, to again return the operation to a fetch operation to fetch the first instruction, instruction I0. However, there is provided in the channel memory 2302 a second set of instructions that are initiated at an addressable location 2504, this second set of instructions having an instruction sequence I3, I5, I8 and a final instruction of EOO. Of course, any instructions could be contained within the sequence and, even an interlacing of instructions could be provided. In order to jump to this addressable location 2504, the CPU 128 controls the channel pointer 2310 by setting internal thereto the address of the initial instruction. This is stored in an internal buffer therein. The channel pointer 2310 will initiate its operation at the addressable location 2504 if the value thereof is stored as the initial value INIT 2. When the last instruction is reached, the instruction EOO, the channel pointer 2310 will be reset to its initial value. This resetting is controlled, of course, through the instruction register 2304. When the program resets itself, it resets itself back to the INIT 2 addressable location, addressable location 2504.

Figure 26:
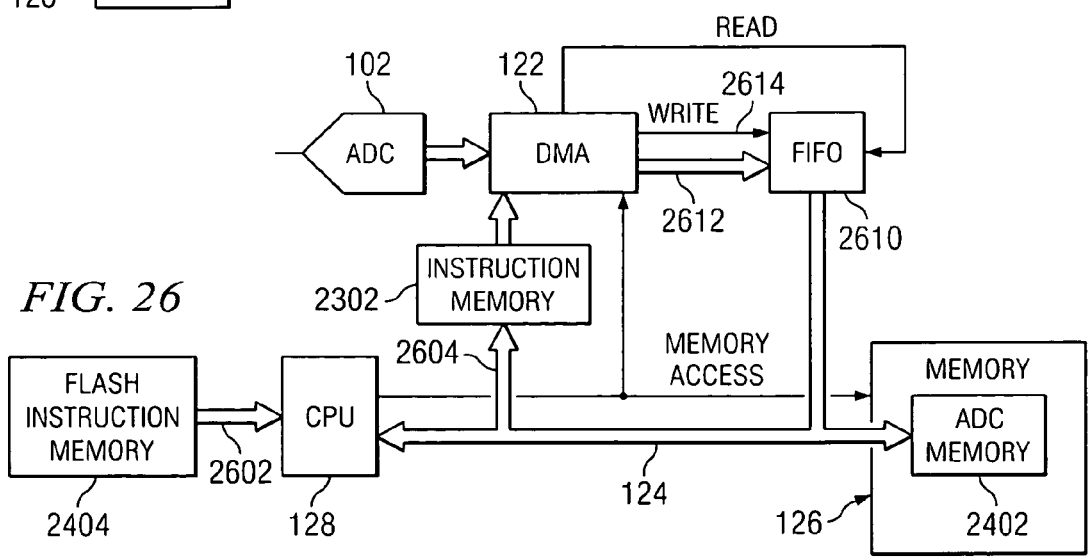
FIG. 26 illustrates a block diagram of the overall mixed signal processor integrated circuit.

Referring now to FIG. 26, there is illustrated a diagrammatic view of the mixed signal integrated circuit of the present disclosure. The CPU 128 is operable to interface with the databus 124, which databus 124 interfaces with the memory 126. Instructions can be uploaded from the flash memory 2404 on power-up by the CPU 128, which flash instruction memory 2404 interfaces with the CPU 128 through a dedicated bus 2602; however, it is noted that the databus 124 could also be utilized to extract instructions from the flash memory 2404. During operation, the CPU 128 will extract instructions from the flash memory 2404 for operations thereon. This is described in U.S. patent application Ser. No. 09/901,908, entitled "METHOD AND APPARATUS FOR PRACTICING INTERNAL MEMORY FROM EXTERNAL ACCESS," filed Jul. 9, 2001. This application is incorporated herein by reference in its entirety. The channel memory 2302 is operable to have data stored therein by the CPU 128 upon power-up through a port associated with the databus 2604. The memory 2302 could be a dual-port memory or it could have the address bus thereof multiplexed with the databus 124 and the address bus (not shown) in that it could share the same addressing space or have a dedicated addressing space. It should be understood that databus 124 represents both data and address information. However, it is merely noted that, during power-up, data will be transferred to the instruction memory 2302 and, after power-up, data would merely be transferred to the DMA 122 for the configuration operation. The DMA 122 is operable to interface with the ADC 102, as described hereinabove and transfer the results to a FIFO 2610 through a databus 2612. The FIFO 2610, in this embodiment, is two registers deep, i.e., it will store two results of the sample operation of the data conversion operation. The DMA 122 is operable to control the Write operation of the FIFO 2610, such that for each data conversion cycle, the data will be written to a location in the FIFO 2610. This will occur with a Write control line 2614 that is operable to control the Write pointer and the Write operation. The DMA 122 also controls the Read operation, which is operable to generate a Read access signal and a Read pointer. This Read operation is operable to output information from the FIFO 2610 onto the databus 124 for writing into the memory 126. When a Read operation is performed on the FIFO 2610, this Read operation will be in conjunction with a Write operation to the memory 126 in the ADC portion of the memory, ADC memory 2402. To facilitate this, the DMA 122 will monitor the operation of the CPU 128 in order to determine if the instruction that is currently being handled by the CPU 128 requires memory access. If the instruction being carried out by the CPU 128 involves a memory access, then the DMA 122 will delay the Read operation of the FIFO 2610 until the CPU 120 has "released" the memory access. The DMA 122 can facilitate this determination in a number of ways. First, it could actually examine each instruction that has been fetched by the CPU 128 and make a determination as to what operation that instruction is associated with. Alternatively, in the preferred embodiment disclosed herein, the DMA 122 examines the control signal output from the CPU 128 that is associated with a memory access. However, it should be understood that any method for determining that the CPU 128 is accessing the memory 126 or will access it in a short period of time, can be utilized in order to delay the output of the FIFO. Therefore, the Read operation on the FIFO 2610 is a function of the instructions carried out and the operations performed by the CPU 128, such that the DMA 122 does not "steal" the databus or assert priority thereon for the purpose of storing data. The reason that this can be facilitated is that the data is only generated once every SAR conversion cycle and the DMA 122 has sufficient latitude for the time that this data transfer will take place within a SAR conversion cycle or within a number of SAR conversion cycles, depending upon how deep the FIFO 2610 is designed to be.

Figure 27:
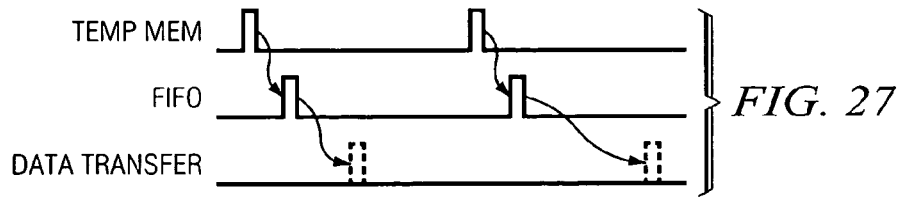
FIG. 27 illustrates the timing diagram for transfer of data from the FIFO to the main memory.

Referring now to FIG. 27, there is illustrated a timing diagram depicting the data transfer operation. The temporary memory, i.e., the latch 838, will have stored therein the results of the data conversion operation at the end of the SAR conversion cycle. This will then be transferred to the FIFO 2610 at the end of that SAR conversion cycle, such that the latch 838 can be utilized for the next SAR conversion operation. However, an even more intermediate memory could be utilized between the FIFO and the latch 838. After information is stored in the FIFO, the data transfer can occur at any time thereafter, this represented by a dotted line.

Figure 28:
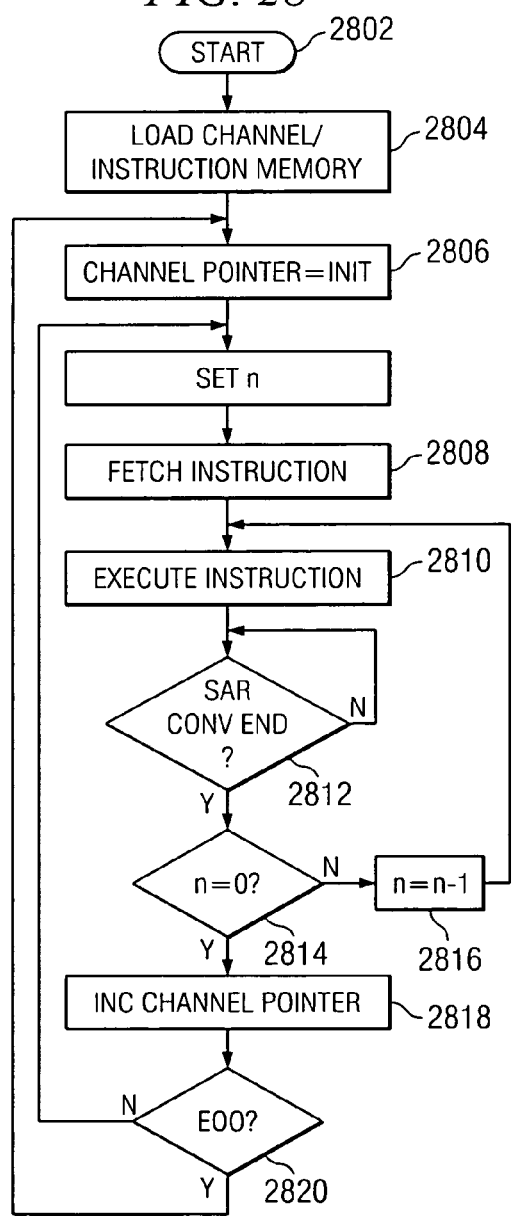
FIG. 28 illustrates a flow chart depicting the operation of loading the channel memory.

Referring now to FIG. 28, there is illustrated a flow chart depicting the operation of loading instructions from the channel memory 2302. This is initiated at a block 2802 and then proceeds to the function block 2804 to load the channel/instruction memory from flash memory, this being the power-up operation. The program then flows to a function block 2806 to initialize the channel pointer at an initial value and setting the repeat counter "n." The program then flows to a function block 2808 to fetch the instruction indicated by the channel pointer and then proceeds to a function block 2810 in order to execute the instruction and then to a decision block 2812 to determine if the end of the SAR conversion cycle has occurred. At the end of the SAR conversion cycle, the program will flow along a "Y" path to a decision block 2814 in order to determine if the value of "n" is equal to zero. If not, this indicates that the instruction has set the value to a larger value than "0" and the program will flow along an "N" path to a function block 2816 in order to decrement the value of "n" and then to the input of the function block 2810 to carry out the next instruction. This will occur until the value of the "n" has been decremented, at which time the program will flow along the "Y" path to a function block 2818 to increment the channel pointer. The program then flows to decision block 2820 to determine if the last instruction in the sequence has occurred, i.e., that being the EOO instruction. If not, the program will flow along the "N" path back to the input of the function block 2808 set the repeat count again and to fetch the next instruction and then this instruction will be carried out. When the last instruction in the sequence is carried out, the program will flow along the "Y" path from the decision block 2820 back to the input of the function block 2806 where the channel pointer will be reset. However, this will be reset to the initial value which can be changed by the CPU 128.

Figure 29:
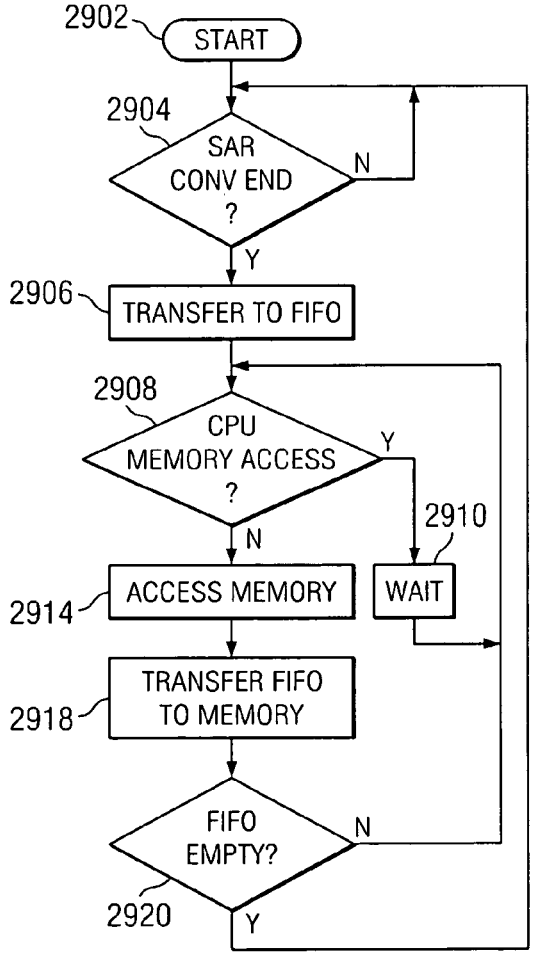
FIG. 29 illustrates a flow chart for transfer of information to the FIFO.

Referring now to FIG. 29, there is illustrated a flow chart depicting the operation of transferring information from the FIFO. The program is initiated at a block 2902 and then proceeds to a decision block 2904 to determine if the end of the SAR conversion cycle has occurred. If so, the program will flow along a "Y" path to a function block 2906 to transfer data to the FIFO and then to a decision block 2908 to determine if the CPU is currently accessing the memory. If so, the program will flow along a "Y" path to a WAIT function block 2910 to delay the data transfer operation from the FIFO by a predetermined amount of time or until the CPU has released the databus. Once the data is ready to be transferred, i.e., either due to the predetermined amount of delay having occurred or because the CPU has released the bus, the program will flow along the "N" path to a function block 2914 in order to access the memory. It should be understood that the DMA 122 could base its initial decision upon the fact that the CPU has seized the databus and did not assert priority immediately and delay the Read operation from the FIFO. However, it could also be that the DMA 122 will only wait a certain amount of time before it will actually then assert priority. It is only necessary that the DMA 122 have at least some delay for at least a portion of the time after the FIFO has been loaded with the data, i.e., there will be some "elastic" transfer associated with the transfer of data from the FIFO. This amount of time depends upon the size of the FIFO.

Once the memory is accessed, the program flows to a function block 2918 in order to transfer the information in the FIFO to memory and then to a decision block 2920 to determine if the FIFO is empty. If not, the program flows along a "N" path back to the input of decision block 2908. If the FIFO is empty, the program flows from the decision block 2920 along the "Y" path to the input of decision block 2904.

Referring now to FIG. 30, there is illustrated a flow chart depicting an alternate mode of operation which allows the instructions to be carried out in an "interleaved" manner. As such, instead of executing each instruction completely, i.e., "n" times, each instruction will be executed once until the end of operation command, EOO, at which time the first instruction will then be executed again. This will occur for a plurality of cycles. There will be "n" cycles in this situation.

The flow is initiated at a block 3002 and then proceeds to a function block 3004 to load the channel/instruction memory. The program then flows to a function block 3006 to set the value of "n" to a start value. The program then flows to a function block 3008 to initialize the pointer value to an initial value. The program then flows to a function block 3010 to fetch the first instruction and then to a function block 3011 to execute the next instruction, i.e., this being when the channel pointer is initialized. The program then flows to a decision block 3012 in order to determine if the SAR conversion operation has been completed. When complete, the program will flow along a "Y" path to a function block 3014 to increment the channel pointer to the next instruction and then to a decision block 3016 to determine if that next instruction is an end of operation instruction. If not, the program will flow along the "N" path back to the input of function 3010 to fetch the instruction for the next pointer location. The program, when the EOO instruction is reached, will flow along the "Y" path from decision block 3016 to a decision block 3018 to determine if the value of "n" is equal to zero. If not, then the program flows to a function block 3020 along an "N" path to decrement the value of "n" and then to the input of the function block 3008 to again initialize the channel pointer at the first instruction and then repeat the operation through each instruction one additional time. As such, each cycle for each value of "n" will result in each instruction being executed only a single time. This will continue for "n" cycles, at which time the program will flow along a "Y" path from decision block 3018 to an END block 3022.

Although the preferred embodiment has been described in detail, it should be understood that various changes, substitutions and alterations can be made therein without departing from the spirit and scope of the invention as defined by the appended claims.

What is claimed is:

1. A mixed signal integrated circuit, comprising:
    a data conversion circuit that is operable to receive an analog input signal and convert discrete samples thereof at a predetermined sampling rate to a digital representation thereof as a plurality of digital words;
    a memory for storing said digital words generated by said data conversion circuit;
    a processor operable to access said memory to output select ones of said digital words for processing thereof in accordance with a predetermined processing algorithm;
    a memory access controller for controlling access to said memory by said data conversion circuit and said processor; and
    said memory access controller restricting access to said memory by said data conversion circuit without interrupting the generation of digital words by said data conversion circuit when said processor is accessing said memory, and allowing access to said memory by said data conversion circuit when said processor is not accessing said memory, such that said data conversion circuit can transfer currently generated digital words and previously generated and non stored digital words for storage in said memory upon gaining access thereto.

2. The mixed signal integrated circuit of claim 1, and further comprising an elastic buffer for storing said digital words after generation thereof if said memory access controller determines that said processor is accessing said memory.

3. The mixed signal integrated circuit of claim 2, wherein said elastic buffer comprises a First-in First-out (FIFO) memory.

4. The mixed signal integrated circuit of claim 3, wherein said FIFO has a depth of two allowing storage of two of said digital words.

5. The mixed signal integrated circuit of claim 1, and further comprising:
    a configuration device for configuring the operation of said data conversion circuit, said data conversion circuit having a plurality of different configurations;
    a configuration controller for controlling the operation of said data conversion circuit to operate in one of the plurality of configurations; and
    a DMA controller for accessing said memory to extract configuration instructions therefrom, which configuration instructions are utilized by said configuration controller, said memory operable to store a plurality of instructions therein, said DMA controller operable to access the stored instructions and said configuration controller operable to execute said accessed instruction at least twice per access, said DMA controller operable after execution of each instruction to store the results of the data conversion operation in said memory.

6. The mixed signal integrated circuit of claim 5, wherein said instructions are organized in a list from an initial instruction to a final instruction and said DMA controller is operable to access said instructions in a sequential manner.

7. The mixed signal integrated circuit of claim 6, wherein each of said instructions is executed "n" times per each access, with n greater than one, and said DMA controller is operable after each of said instructions is executed to sequence to the next of said instructions.

8. The mixed signal integrated circuit of claim 7, wherein the value of n is the same for all of said instructions.

9. The mixed signal integrated circuit of claim 7, wherein said list has as the last instruction therein an End Of Operation (EOO) instruction that is interpreted by said configuration controller as not a configuration operation and said DMA controller is operable in response to the access of said EOO instruction to jump to the first instruction in said list.

10. The mixed signal integrated circuit of claim 5, wherein said instructions are organized in a plurality of lists, each list organized from an initial instruction to a final instruction and said DMA controller is operable to access said instructions in a select one of said lists in a sequential manner.

11. The mixed signal integrated circuit of claim 10, wherein each of said instructions in the select one of said lists is executed "n" times per each access, with n greater than one, and said DMA controller is operable after each of said instructions is executed to sequence to the next of said instructions.

12. The mixed signal integrated circuit of claim 11, wherein each of said lists has as the last instruction therein an End Of Operation (EOO) instruction that is interpreted by said configuration controller as not a configuration operation and said DMA controller is operable in response to the access of said EOO instruction to jump to the first instruction to another of said lists.

* * * * *